United States Patent
Hirano et al.

(10) Patent No.: US 11,362,685 B2
(45) Date of Patent: Jun. 14, 2022

(54) NONVOLATILE MEMORY DEVICE AND READ AND COPY-BACK METHODS THEREOF

(71) Applicant: SAMSUNG ELECTRONICS CO., LTD., Suwon-si (KR)

(72) Inventors: Makoto Hirano, Seongnam-si (KR); Woojung Sun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 16/891,664

(22) Filed: Jun. 3, 2020

(65) Prior Publication Data
US 2020/0295788 A1 Sep. 17, 2020

Related U.S. Application Data

(63) Continuation of application No. 15/446,665, filed on Mar. 1, 2017, now Pat. No. 10,720,945.

(30) Foreign Application Priority Data

May 12, 2016 (KP) .......................... 10-2016-0058397

(51) Int. Cl.
*G11C 29/42* (2006.01)
*H03M 13/00* (2006.01)
(Continued)

(52) U.S. Cl.
CPC ..... *H03M 13/6566* (2013.01); *G06F 11/1012* (2013.01); *H03M 13/152* (2013.01); *H03M 13/1545* (2013.01)

(58) Field of Classification Search
CPC ............ G06F 11/1012; G06F 12/0246; G06F 11/1008; G06F 13/1673; G06F 2212/7203;
(Continued)

(56) References Cited

U.S. PATENT DOCUMENTS 6,233,717 B1 * 5/2001 Choi ................... G06F 11/1072
714/764
6,977,858 B2 * 12/2005 Osada ................. H01L 27/0207
714/764
(Continued)

FOREIGN PATENT DOCUMENTS

| CN | 101833996 | 9/2010 |
| JP | 2014137834 | 7/2014 |

(Continued)

OTHER PUBLICATIONS

Office Action dated Mar. 7, 2019 in Corresponding U.S. Appl. No. 15/446,665.
Final Office Action dated Nov. 14, 2019 in Corresponding U.S. Appl. No. 15/446,665.
Notice of Allowance dated Feb. 27, 2020 in Corresponding U.S. Appl. No. 15/446,665.

*Primary Examiner* — Albert Decady
*Assistant Examiner* — Enam Ahmed
(74) *Attorney, Agent, or Firm* — F. Chau & Associates, LLC

(57) ABSTRACT

A read method of a nonvolatile memory device is provided. The method includes storing data sensed from selected memory cells of the nonvolatile memory device into a page buffer, performing an error decoding operation by performing error detection on the sensed data to detect and error, correcting the detected error if the error is detected, and overwriting the page buffer with the corrected data, and de-randomizing data stored in the page buffer by using a seed after the error decoding operation has completed.

20 Claims, 22 Drawing Sheets

(51) Int. Cl.
*H03M 13/15* (2006.01)
*G06F 11/10* (2006.01)

(58) Field of Classification Search
CPC ........... H03M 13/1545; H03M 13/152; H03M 13/6566; G11C 29/44; G11C 29/42
USPC ....................................................... 714/764
See application file for complete search history.

(56) References Cited

U.S. PATENT DOCUMENTS

| | | | |
|---|---|---|---|
| 7,159,069 | B2 | 1/2007 | Adusumilli et al. |
| 7,305,596 | B2 | 12/2007 | Noda et al. |
| 7,409,473 | B2 | 8/2008 | Conley et al. |
| 7,679,133 | B2 | 3/2010 | Son et al. |
| 7,849,381 | B2 | 12/2010 | Tomlin |
| 8,127,200 | B2 | 2/2012 | Sharon et al. |
| 8,301,912 | B2 | 10/2012 | Lin et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,665,648 | B2 | 3/2014 | Mun et al. |
| 8,694,720 | B2 | 4/2014 | Lee et al. |
| 8,751,729 | B2 | 6/2014 | Mun et al. |
| 8,812,933 | B2 | 8/2014 | Joo et al. |
| 8,819,332 | B2 | 8/2014 | Suto et al. |
| 8,856,428 | B2 | 10/2014 | Lee et al. |
| 8,867,283 | B2 | 10/2014 | Park et al. |
| 8,990,481 | B2 | 3/2015 | Yoon et al. |
| 9,128,623 | B2 | 9/2015 | Mun et al. |
| 10,684,914 | B2 * | 6/2020 | Im ...................... G06F 11/1068 |
| 2002/0013924 | A1 | 1/2002 | Yamamoto |
| 2010/0232221 | A1 | 9/2010 | Park et al. |
| 2010/0259983 | A1 | 10/2010 | Yoon |
| 2011/0035539 | A1 | 2/2011 | Honda |
| 2011/0233648 | A1 | 9/2011 | Seol et al. |
| 2012/0221775 | A1 | 8/2012 | Kim et al. |
| 2012/0284589 | A1 | 11/2012 | Kim et al. |
| 2013/0135934 | A1 | 5/2013 | Kim et al. |
| 2013/0145234 | A1 * | 6/2013 | Yoon ................... G06F 11/1068 |
| | | | 714/773 |
| 2014/0169092 | A1 * | 6/2014 | Miyamoto ............. G11C 16/24 |
| | | | 365/185.09 |
| 2014/0317469 | A1 * | 10/2014 | Sohn ................... G06F 11/1052 |
| | | | 714/764 |
| 2015/0154067 | A1 * | 6/2015 | Rho .................... G06F 11/1044 |
| | | | 714/773 |
| 2015/0193163 | A1 | 7/2015 | Mun et al. |
| 2015/0228344 | A1 | 8/2015 | Park |
| 2015/0248328 | A1 * | 9/2015 | Yoon ...................... G11C 29/52 |
| | | | 714/764 |
| 2015/0248329 | A1 * | 9/2015 | Kang ............... G11C 11/40618 |
| | | | 714/764 |
| 2015/0294730 | A1 | 10/2015 | Lee et al. |
| 2015/0363262 | A1 * | 12/2015 | Hu ...................... G06F 11/1048 |
| | | | 714/773 |
| 2016/0062827 | A1 * | 3/2016 | Yamauchi .......... G11C 16/3459 |
| | | | 714/764 |
| 2016/0253239 | A1 | 9/2016 | Um |
| 2017/0329667 | A1 | 11/2017 | Hirano et al. |

FOREIGN PATENT DOCUMENTS

| | | |
|---|---|---|
| KR | 1020120097963 | 9/2012 |
| KR | 1020120126388 | 11/2012 |
| KR | 1020130043534 | 4/2013 |
| KR | 10-2014-0049448 | 4/2014 |
| KR | 1020150064799 | 6/2015 |

\* cited by examiner

Source page | NOP1 | NOP2 | NOP3 | NOP4 | Flag

FIG. 18

NOP Register

| State NO. | Status | NOP1 | NOP2 | NOP3 | NOP4 |
|---|---|---|---|---|---|
| 1 | Source data | Program | Program | Erase | Erase |
| 2 | Source NOP | T | T | F | F |
| 3 | Copy-back Din | F | T | T | F |
| 4 | Randomize Din | F | T | (F) | F |
| 5 | Destination NOP | F | T | T | F |
| 6 | De-randomize NOP (with source seed) | T | T | (F) | F |
| 7 | Randomize NOP (with destination seed) | T | T | T | F |
| 8 | Destination data | Program | Program | Program | Erase |

T:True
F:False

FIG. 20
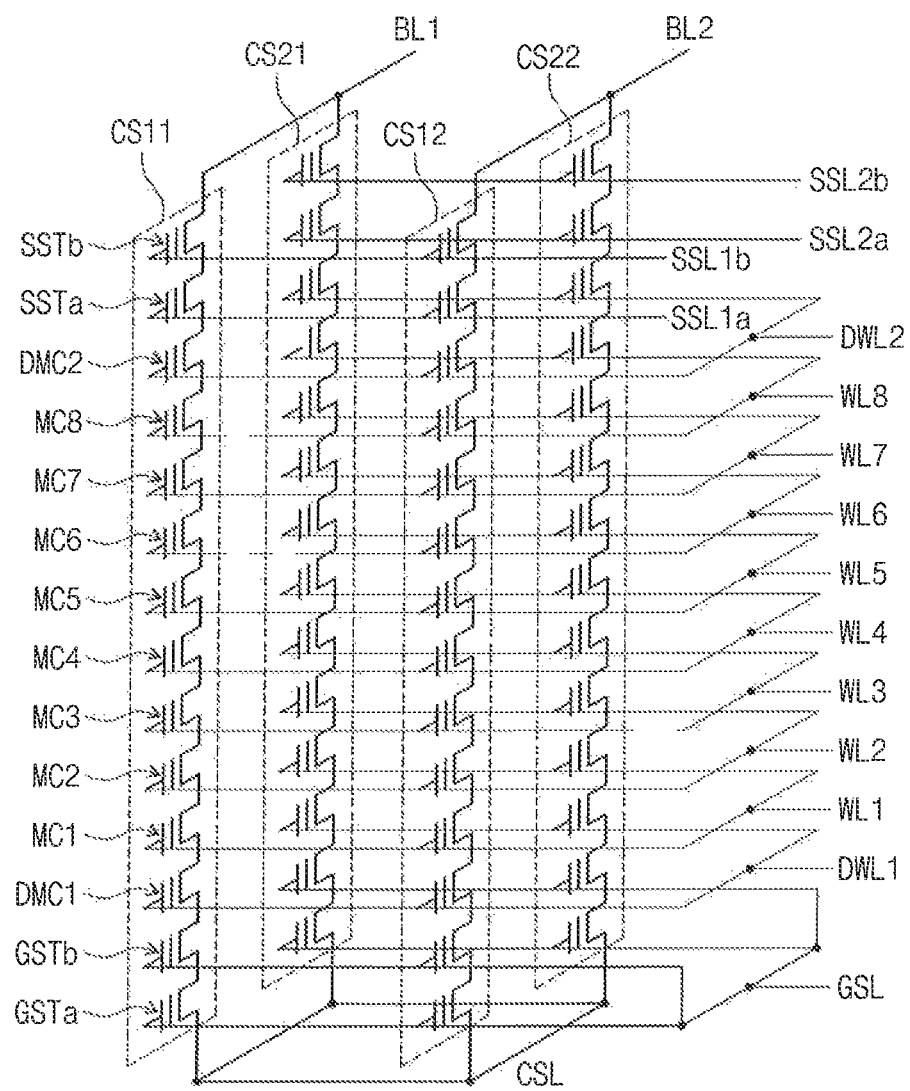
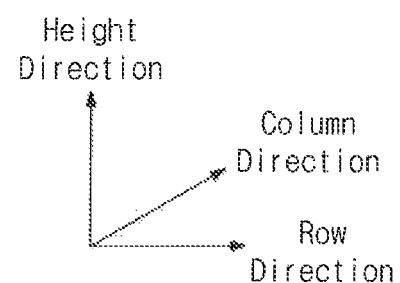

US 11,362,685 B2

NONVOLATILE MEMORY DEVICE AND READ AND COPY-BACK METHODS THEREOF

CROSS-REFERENCE TO RELATED APPLICATIONS

This application is a continuation application of U.S. patent application Ser. No. 15/446,665 filed Mar. 1, 2017, which claims priority under 35 U.S.C. § 119 is made to Korean Patent Application No. 10-2016-0058397 filed May 12, 2016, in the Korean Intellectual Property Office, the disclosures of which are incorporated by their references herein.

BACKGROUND

1. Technical Field

The inventive concept described herein relates to a semiconductor memory device, and more particularly, to a nonvolatile memory device that is capable of improving the integrity of data and read performance and read and copy-back methods thereof.

2. Discussion of Related Art

Semiconductor memory devices are classified into volatile semiconductor memory devices and nonvolatile semiconductor memory devices. The read and write speed of the volatile semiconductor memory device is relatively fast, but data stored therein is lost when a power supply voltage is interrupted. However, the nonvolatile semiconductor memory device retains data stored therein when the power supply is interrupted. Therefore, the nonvolatile semiconductor memory device may be used to store data when a power supply voltage is not reliable.

A flash memory device is an example of the nonvolatile semiconductor memory device. The flash memory device may be used to store voice and image data. A nonvolatile memory device may include an on-chip error correcting circuit (ECC) for performing error detection and correction operations and an on-chip randomizer for performing randomization operations.

However, reads and writes may slow down when a nonvolatile memory performs the error detection and correction operations or the randomization operations. Accordingly, there is a need for a technology capable of improving read and write performance even though these operations are performed in the nonvolatile memory device.

SUMMARY

At least one embodiment of the inventive concept provides a nonvolatile memory device that includes an on-chip ECC and an on-chip randomizer capable of improving a read speed and reliability and an operating method thereof.

A read method of a nonvolatile memory device according to an exemplary embodiment of the inventive concept includes storing data sensed from selected memory cells of the nonvolatile memory device into a page buffer, performing an error decoding operation by performing error detection on the sensed data, correcting the detected error if the error is detected, and overwriting the page buffer with the corrected data, and de-randomizing data stored in the page buffer by using a seed after the error decoding operation has completed.

A copy-back method of a nonvolatile memory device according to an exemplary embodiment of the inventive concept includes sensing source data from a source area of the nonvolatile memory device to store the sensed source data into a page buffer, randomizing supplement data by using a source seed, and updating the source data stored in the page buffer, by using the randomized supplement data.

A nonvolatile memory device according to an exemplary embodiment of the inventive concept includes a cell array including memory cells arranged in rows and columns, a page buffer configured to write data into the cell array or sense data stored in the cell array, a first circuit (e.g., a scramble block) configured to randomize data to be written into the cell array, to provide the randomized data to the page buffer or de-randomize data output from the page buffer, a second circuit (e.g., an error correction block) configured to perform error correction decoding with respect to the sensed data to generate error correction decoded data, and control logic configured to control the page buffer, the first circuit, and the second circuit. During a data read operation, the control logic controls the page buffer and the first circuit such that data stored in the page buffer is decoded by the second circuit and such that the error correction decoded data is overwritten onto the page buffer and controls the first circuit such that a de-randomization operation is performed when the data overwritten onto the page buffer is output.

A nonvolatile memory device according to an exemplary embodiment of the inventive concept includes a cell array including at least one memory cell, a page buffer, a first circuit, a second circuit, and a control circuit. The control circuit is configured to store write data into the page buffer in response to an external write command, use the first circuit to scramble the write data to generate scrambled data, use the second circuit to perform error correction encoding on the scrambled data to generate encoded data, overwrite the write data stored in the page buffer with the encoded data, and copy the encoded data stored in the page buffer to the cell array.

BRIEF DESCRIPTION OF THE FIGURES

The inventive concept will become apparent from the following description with reference to the following figures, wherein like reference numerals refer to like parts throughout the various figures unless otherwise specified, and wherein:

FIG. 8 is a table briefly illustrating an ECC frame corresponding to an error decoding result with respect to a codeword provided to the error correction block;

FIG. 17 is a diagram illustrating a page area divided into a plurality of write units;

FIG. 18 is a table illustrating a copy-back operation performed based on an NOP register of FIG. 16;

FIG. 20 is a circuit diagram illustrating one of memory blocks included in the cell array in FIG. 1, 12, 16, or 19;

DETAILED DESCRIPTION OF THE EXEMPLARY EMBODIMENTS

Figure 1:
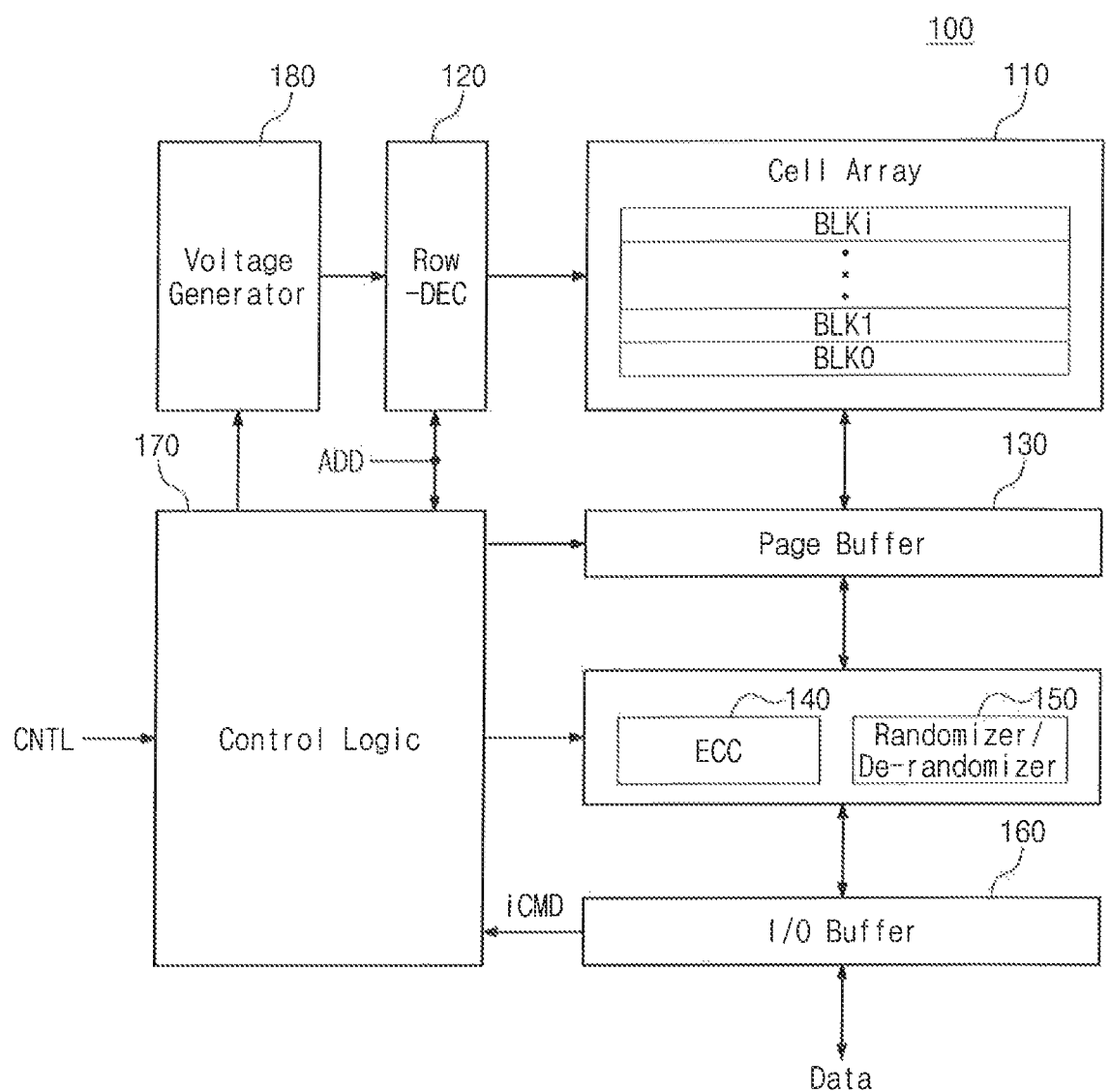
FIG. 1 is a block diagram of a nonvolatile memory device according to an exemplary embodiment of the inventive concept.

FIG. 1 is a block diagram of a nonvolatile memory device according to an exemplary embodiment of the inventive concept. Referring to FIG. 1, the nonvolatile memory device 100 includes a cell array 110, a row decoder 120, a page buffer 130, an error correction block 140 (e.g., a circuit configured to perform error correction), a randomizer/de-randomizer 150 (e.g., a circuit configured to generate a random number from a value and/or to generate the value from the random number), an input/output (I/O) buffer 160, control logic 170 (e.g., a control circuit), and a voltage generator 180.

The cell array 110 is connected to the row decoder 120 through word lines and selection lines. The cell array 110 is connected to the page buffer 130 through bit lines. The cell array 110 includes a plurality of NAND cell strings. A channel of each NAND cell string may be formed in a vertical or horizontal direction. The cell array 110 according to an embodiment of the inventive concept includes a plurality of memory cells constituting a NAND cell string. The memory cells may be programmed, erased, and read by voltages provided to the bit lines or word lines. A program operation may be performed by a page unit or by a write unit, which is smaller than the page unit (e.g., an NOP unit), and an erase operation may be performed in units of blocks. For example, the cell array 110 may include a plurality of blocks BLK0, BL1, . . . , BLKi, where each block includes a plurality of pages, and each page is divided further into portions having the size of the write unit.

In an embodiment of the present inventive concept, the cell array 110 is provided as a three dimensional (3D) memory array. The 3-D memory array may be monolithically formed in one or more physical level(s) of a memory cell array having an active area arranged on a circuit related on a silicon substrate and an operation of memory cells. The circuit related on an operation of memory cells may be located in a substrate or on a substrate. The term "monolithic" means that layers of each level of the 3D array are directly deposited on the layers of each underlying level of the 3D array.

In an embodiment of the inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells. At least one selection transistor may have the same structure as memory cells, and be monolithically formed together with memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

In an embodiment, the row decoder 120 selects one of a plurality of memory blocks in the cell array 110 in response to an address ADD. The row decoder 120 may select one of the word lines of the selected memory block in response to the address ADD. The row decoder 120 may supply a voltage corresponding to a mode of operation to a word line of the selected memory block. During a program operation, the row decoder 120 may supply a program/verification voltage to a selected word line and a pass voltage to each of unselected word lines. During a read operation, the row decoder 120 may supply a selection read voltage to the selected word line and a non-selection read voltage to each of the unselected word lines.

The page buffer 130 may operate as a write driver or a sense amplifier. During the program operation, the page buffer 130 may supply a bit line voltage corresponding to data to be programmed to a bit line of the cell array 110. During the read operation or a verification read operation, the page buffer 130 may sense data stored in selected memory cells through the bit lines. In addition, the page buffer 130 may provide a buffer function during an encoding or decoding operation of the error correction block 140 or the randomizer/de-randomizer 150. For example, data randomized during a randomization operation may be overwritten on source data that is not randomized. The buffer function of the page buffer 130 may be also performed during an error correction operation.

The error correction block 140 (e.g., a second circuit) performs encoding and decoding for error correction and the randomizer/de-randomizer 150 (e.g., a first circuit) may perform scrambling with respect to data loaded on the page buffer 130. In an embodiment, the scrambling obfuscates or removes sensitive data from within an area of memory. In an embodiment, the scrambling process is irreversible so that the original data cannot be derived from the scrambled data. When data is programmed into the cell array 110, write data may be sent to the page buffer 130 from the input/output buffer 160. The write data stored in the page buffer 130 may be randomized by the randomizer/de-randomizer 150. The randomized write data may be encoded by the error correction block 140 for error correction. The encoded data may be again provided to the page buffer 130. The randomized and encoded data in the page buffer 130 may be programmed into a destination area of the cell array 110.

In addition, during the read operation, data sensed by the page buffer 130 may be provided to the error correction block 140. That is, whether an error is present in the sensed data provided from the page buffer 130 is determined by the error correction block 140. If it is determined that the error is present in the sensed data, the error correction block 140 may correct the error based on an error location of the page buffer 130. For example, the error correction block 140 may correct the error based on the location of the sensed data within the page buffer 130. The error-corrected read data in the page buffer 130 may be de-randomized while it is sent to the input/output buffer 160 or after it is output through the input/output buffer 160.

Overwriting of a full page within the page buffer 130 may be minimized by performing error decoding and de-randomization with respect to the read data in the above-described sequence. The overwriting may be minimized because the de-randomization operation is performed while the error-corrected data is sent from the page buffer 130 to the input/output buffer 160. In an embodiment, after the de-randomization operation is performed with respect to the error-corrected data, the de-randomized data is stored in the page buffer 130 and data of a full page is overwritten within the page buffer 130. In this embodiment, the data of the full page is overwritten because the arrangement of data sensed and latched by the page buffer 130 is completely changed by the de-randomization operation. However, due to the error correction block 140 and randomizer/de-randomizer 150, there is no need to overwrite a full page within the page buffer 130 for de-randomization. In addition, the error correction block 140 according to an embodiment of the inventive concept overwrites only data of a specific unit corresponding to an error location only when an error is present. Accordingly, overhead due to error correction may be minimized when no error is present. This will be described in detail with reference to the following accompanying drawings.

The I/O buffer 160 may provide data to the page buffer 130. The data provided by the I/O buffer 160 may be supplied by a source located outside the nonvolatile memory device 100. The I/O buffer 160 may provide a command iCMD to the control logic 170. The command iCMD provided by the I/O buffer 160 may be supplied by a source located outside the nonvolatile memory device 100. The I/O buffer 160 may provide the address ADD to the control logic 170 or the row decoder 120. In addition, the I/O buffer 160 may output data, which is sensed and latched by the page buffer 130, to a source located outside the nonvolatile memory device 100. The address ADD may be supplied by a source located outside the nonvolatile memory device 100.

In an embodiment, the control logic 170 (e.g., a control circuit) controls the page buffer 130, the error correction block 140, and the randomizer/de-randomizer 150 in response to a command iCMD or a control signal CNTL from the external device.

In an embodiment, the control logic 170 controls the page buffer 130, the error correction block 140, and the randomizer/de-randomizer 150 based on the command iCMD to perform program, read, or erase operations with respect to selected memory cells.

In particular, during a data read operation, the control logic 170 may control the randomizer/de-randomizer 150 such that the de-randomization operation is performed after error correction decoded data is stored into the page buffer 130. For example, the error correction decoded data stored in the page buffer 130 may be provided to the randomizer/de-randomizer 150 while a read enable signal /RE is toggled. Data, which is de-randomized by the randomizer/de-randomizer 150, may be output to a source located outside the nonvolatile memory device 100 through the input/output buffer 160.

In an embodiment, the randomizer/de-randomizer 150 includes a seed generator that instantly generates a seed based on a column address of data sequentially provided from the page buffer 130.

Under control of the control logic 170, the voltage generator 180 may generate various kinds of word line voltages to be respectively supplied to word lines and a voltage to be supplied to a bulk (e.g., a well area), in which memory cells are formed. The word line voltages to be respectively supplied to the word lines may include a program voltage Vpgm, a pass voltage Vpass, selection and non-selection read voltages Vrd and Vread, etc.

In the nonvolatile memory device 100 according to an exemplary embodiment of the inventive concept, during the data read operation, data, to which an error correction operation is applied, is overwritten within the page buffer 130 without the de-randomization operation. A de-randomization operation using a source seed may be performed with respect to data that is output from the page buffer 130 to the input/output buffer 160. During the data read operation, in an embodiment where data, to which an error correction operation and a de-randomization operation both are applied, is overwritten onto the page buffer 130, even though no error is present in the data, data, of which the arrangement is changed according to a randomization operation, may be overwritten in the units of full pages. In an exemplary embodiment, data, which is to be exchanged among the page buffer 130, the error correction block 140, and the randomizer/de-randomizer 150, passes through a column selector (not illustrated) and a column repair circuit. Such a configuration may result in overhead because input/output lines between the page buffer 130 and the input/output buffer 160 are used.

According to an exemplary embodiment of the inventive concept, however, since the de-randomization operation is performed with respect to data output from the page buffer 130 to a source located outside the nonvolatile memory device 100, overwriting may be minimized when no error is present. In addition, the error correction block 140 according to an embodiment of the inventive concept is capable of correcting an error of partial data in which an error is present and may overwrite the corrected partial data within the page buffer 130. According to an embodiment of the inventive concept, thus, it may be possible to minimize various delays due to the error correction and de-randomization operations during the read operation. Thus, through an embodiment of the inventive concept, it may be possible to markedly improve the read performance of a nonvolatile memory device that does not include an on-chip buffer (e.g., a static random access memory (SRAM)).

Figure 2:
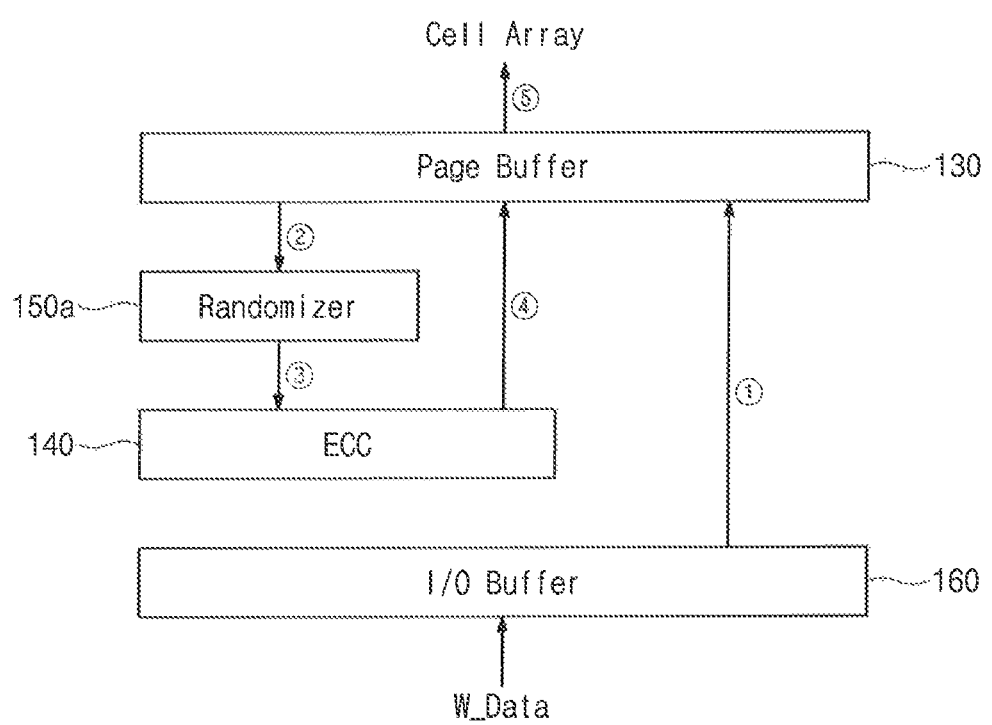
FIG. 2 is a block diagram illustrating a write data processing procedure of the nonvolatile memory device of FIG. 1.

FIG. 2 is a block diagram illustrating a write data processing procedure of the nonvolatile memory device of FIG. 1. Referring to FIG. 2, a write command, an address, and write data W_Data may be provided from a source located outside the nonvolatile memory device 100.

Although not illustrated in FIG. 2, the write command and address may be provided from the input/output buffer 160 to the control logic 170, the row decoder 120, or a column decoder (not illustrated). The write data W_Data may be provided from the input/output buffer 160 to the page buffer 130. The write data W_Data may be sequentially selected by a column selector (not illustrated) so as to be loaded into the page buffer 130. The data loaded into the page buffer 130 may have, for example, the size of 4 Kbytes. An arrow marked by "①" indicates a flow of the write data W_Data from the input/output buffer 160 to the page buffer 130.

The write data W_Data loaded into the page buffer 130 is provided to a randomizer 150a for randomization. An arrow marked by "②" indicates a flow of the write data W_Data to the randomizer 150a. Here, the randomizer 150a may be a portion of a function of the randomizer/de-randomizer 150 or a part thereof. That is, the randomizer 150a may be an element that scrambles the write data W_Data by using a specific random sequence. Threshold voltages (or a threshold voltage distribution) of memory cells included in the cell array 110 may vary due to interference between adjacent memory cells. The magnitude of the interference may vary according to a pattern of the write data W_Data. The interference between memory cells may be reduced by a pattern of data scrambled through the randomization operation. Accordingly, the randomization operation may improve the read margin or reliability of the nonvolatile memory device 100. In addition, the scrambling may improve security performance.

The write data W_Data randomized by the randomizer 150a is provided to the error correction block 140 for error correction encoding. This data flow is marked by "③". The error correction block 140 may generate parity data by encoding the randomized write data W_Data into units of codewords. Various schemes may be applied to the error correction encoding. For example, the error correction block 140 may perform encoding by using at least one of a Bose-Chaudhuri Hocquenghem (BCH) code, a hamming code, a Reed-Solomon (RS) code, a turbo code, and a low-density parity-check (LDPC) code.

The randomized and encoded Write data W_Data' encoded by the error correction block 140 may be overwritten onto the page buffer 130. For example, data in the page buffer 130 having the location of the write data W_Data may be overwritten with the randomized and encoded write data W_Data'. This data flow is marked by "④". With the above description, the arrangement of the write data W_Data firstly loaded into the page buffer 130 may be different from the arrangement of the randomized and encoded write data W_Data'.

Afterwards, the randomized and encoded write data W_Data' may be programmed to a destination area of the cell array 110. This data flow is marked by "⑤".

The procedure of processing write data in the nonvolatile memory device 100 according to an embodiment of the inventive concept is briefly described. The arrangement of the randomized and encoded write data W_Data' written into a target page may be different from the arrangement of the write data W_Data initially loaded into the page buffer 130 due to the randomization and error correction encoding operations. The arrangement may be restored through error decoding and de-randomization operations during a read operation.

Figure 3:
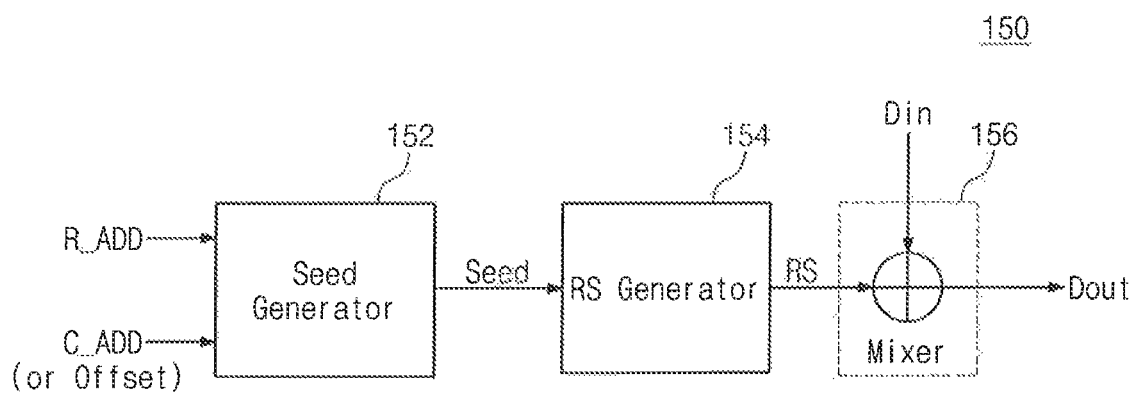
FIG. 3 is a block diagram illustrating a configuration of a randomizer/de-randomizer according to an exemplary embodiment of the inventive concept.

FIG. 3 is a block diagram illustrating the randomizer/de-randomizer 150 according to an exemplary embodiment of the inventive concept. Referring to FIG. 3, the randomizer/de-randomizer 150 according to an embodiment of the inventive concept includes a seed generator 152, a random sequence generator 154, and a mixer 156.

The seed generator 152 may generate a seed, which corresponds to data to be randomized or to be de-randomized, at a high speed. For example, the seed generator 152 may generate a seed for randomizing or de-randomizing data of a unit, which is smaller than a page unit, by using a row address R_ADD and a column address C_ADD (or offset information) of a selected page. That is, the seed generator 152 may generate a seed for randomizing or de-randomizing any one among a plurality of partial data stored in the page buffer 130 at a high speed.

The random sequence generator 154 generates a random sequence (hereinafter referred to as "RS") by using the seed. The random sequence generator 154 generates the random sequence RS in which the input seed is used as an initial value. The random sequence generator 154 may be implemented with a linear feedback shift register that operates in a Fibonacci configuration.

The mixer 156 outputs output data Dout by mixing the random sequence RS and input data Din provided from a randomization or de-randomization operation. In an embodiment, the random sequence RS and the input data Din are mixed by an exclusive-OR (XOR) operation or an XOR gate, and the output data Dout is output as the mixing result.

The randomizer/de-randomizer 150 with the above-described configuration may make it possible to generate a seed with respect to data to be randomized or de-randomized at a high speed. For example, in the case where partial data to be de-randomized corresponds to a column address of the rear portion in one page, the seed may be generated by the seed generator 152 at a high speed.

Figure 4:
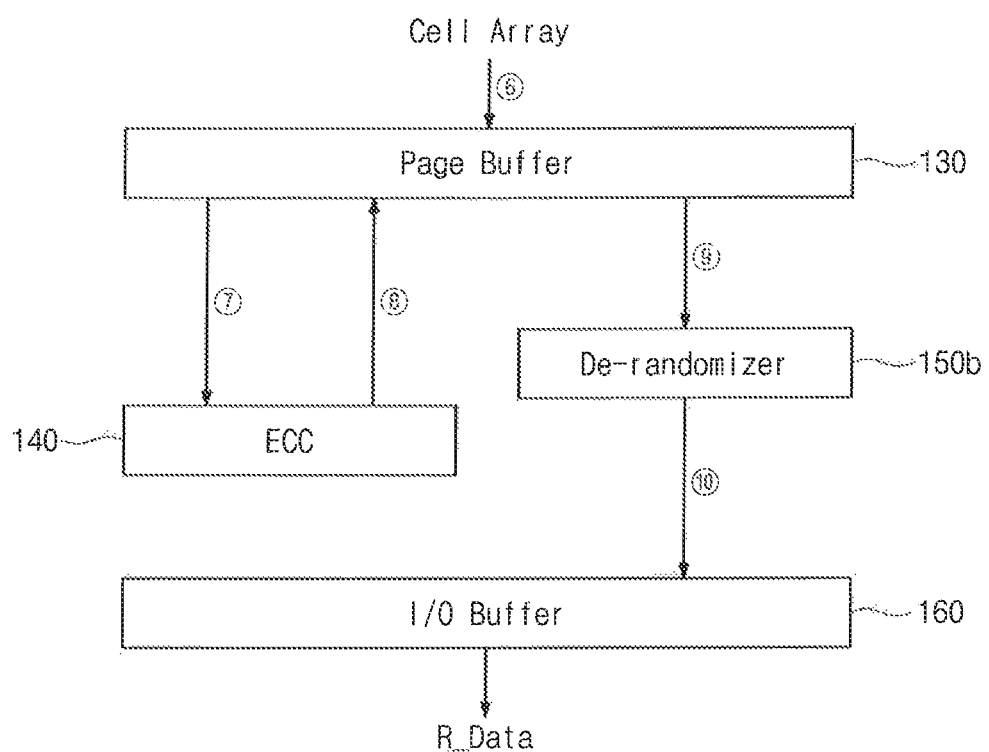
FIG. 4 is a block diagram illustrating a read data processing procedure of the nonvolatile memory device of FIG. 1.

FIG. 4 is a block diagram illustrating a read data processing procedure of the nonvolatile memory device of FIG. 1 according to an exemplary embodiment of the inventive concept. Referring to FIG. 4, the nonvolatile memory device 100 outputs read-requested data in response to a read command and an address.

The page buffer 130 senses the read-requested data corresponding to the address from the cell array 110. The sensed data may be stored in latches of the page buffer 130. This data flow is marked by "⑥".

The latched read data R_Data in the page buffer 130 is provided to the error correction block 140 for error correction decoding. For example, the read data R_Data may be provided to the error correction block 140 in units of codewords. This data flow is marked by "⑦".

The error correction block 140 may detect whether an error is present in data provided from the page buffer 130. One codeword includes parity data capable of detecting an error, and an error may be detected by using the parity data. In error decoding which is performed by using the BCH code, an error bit and an error location thereof may be detected by using the parity data. If the error location is detected, the error correction block 140 may correct an error by overwriting an error-corrected bit onto a bit corresponding to the error location within the page buffer 130 (e.g., through bit switching). The error correction block 140 according to an embodiment of the inventive concept performs error correction processing only with respect to a data area in which an error is present. This data flow is marked by "⑧". Accordingly, if no error is present, overwriting of data onto the page buffer 130 by the error correction block 140 is skipped. The reason is that a de-randomization operation with respect to the read data R_Data is performed when the read data R_Data is output from the page buffer 130 to the input/output buffer 160.

The error-corrected read data R_Data stored in the page buffer 130 may be provided according to an output request (or toggling of the read enable signal /RE) to the de-randomizer 150b in units of specific data. For example, the read data R_Data of a page size may be divided into data of a size smaller than an amount of data transferable by an I/O pin unit so as to be provided to the de-randomizer 150b during a plurality of clock cycles. This data flow is marked by "⑨". The de-randomizer 150b may be a portion of a function of the randomizer/de-randomizer 150 or a part thereof.

The de-randomizer 150b may de-randomize the input read data R_Data at a high speed. According to the structure described with reference to FIG. 3, the de-randomizer 150b may generate a seed at a high speed by using row and column addresses R_ADD and C_ADD of the read data thus provided. The de-randomizer 150b generates a random sequence RS, which is to be applied during a randomization operation, from the generated seed. The de-randomizer 150b may de-randomize the read data R_Data at a high speed on the basis of the generated random sequence RS and the read data R_Data. The read data R_Data generated by the de-randomization operation may be provided to the input/output buffer 160. This data flow is marked by "⑩".

According to the above-described read procedure, the read data R_Data may be first latched by the page buffer 130. Next, the read data R_Data is again overwritten onto the page buffer 130 after being processed by error correction decoding. The de-randomization operation with respect to the read data R_Data is performed when the read data R_Data is output from the page buffer 130 to the input/output buffer 160. According to the read procedure, the de-randomization operation with respect to the read data R_Data is performed when the error correction decoded data is output from the page buffer 130 to the outside. Accordingly, an issue due to the de-randomization operation, that is, a change of the arrangement of data need not be considered any more. In addition, the error correction block 140 according to an embodiment of the inventive concept overwrites only data, in which an error is present, onto the page buffer 130. Accordingly, the overwrite operation is skipped when no error is present.

Figure 5:
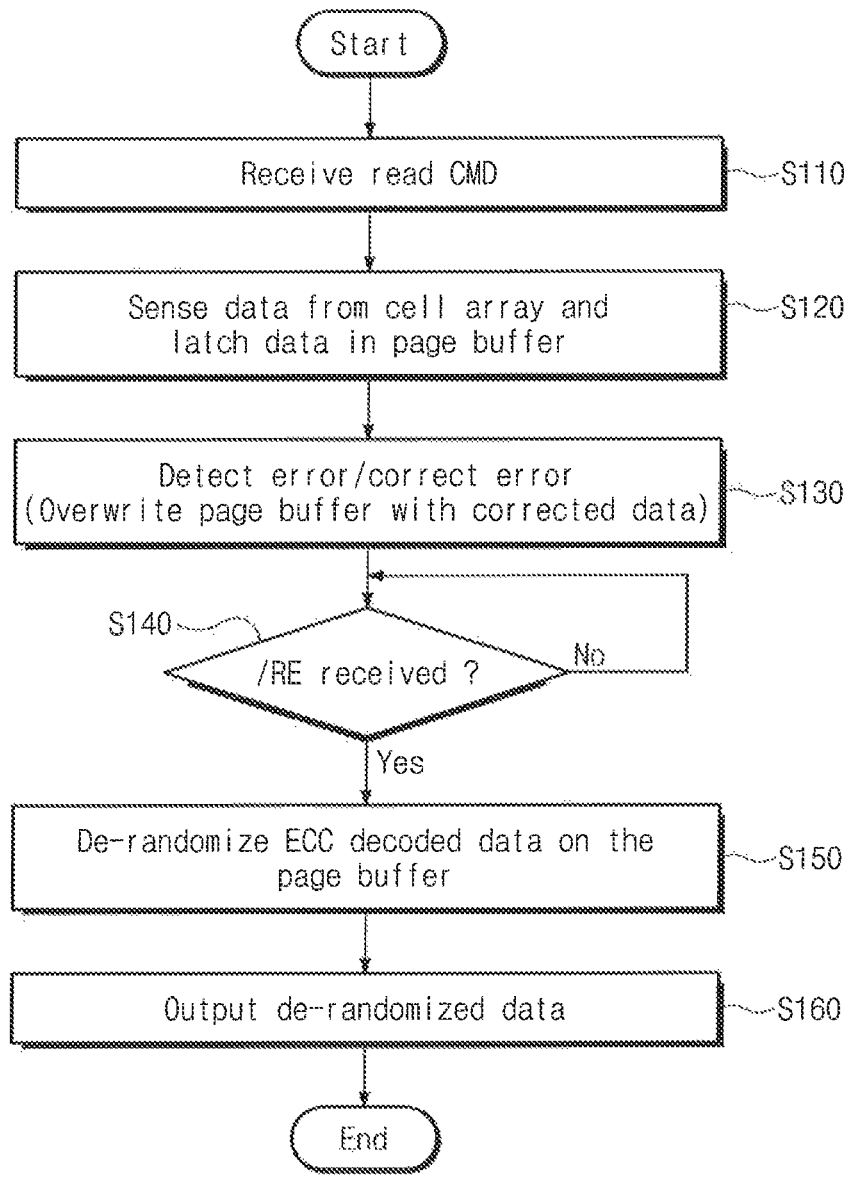
FIG. 5 is a flowchart illustrating a read method of a the memory device according to an exemplary embodiment of the inventive concept.

FIG. 5 is a flowchart illustrating a read method of the memory device 100 according to an exemplary embodiment of the inventive concept. Referring to FIG. 5, an overwrite operation is performed with respect to the page buffer 130 (refer to FIG. 1) only when a result of an error correction decoding operation performed during a read operation indicates that an error is present. In addition, a de-randomization operation with respect to read data R_Data is performed when the read data R_Data is output from the page buffer 130 to the outside.

In operation S110, the nonvolatile memory device 100 (refer to FIG. 1) receives a read command from the outside. The nonvolatile memory device 100 may receive an address together with the read command. The control logic 170 (refer to FIG. 1) may prepare a read operation based on the control signal CNTL that is provided from the outside together with the read command and the address.

In operation S120, the control logic 170 controls the row decoder 120 and the page buffer 130 such that data is sensed from selected memory cells of the cell array 110 corresponding to the address. The page buffer 130 senses and latches data stored in the selected memory cells through the bit lines.

In operation S130, the control logic 170 controls the page buffer 130 and the error correction block 140 such that the latched read data R_Data in the page buffer 130 is sent to the error correction block 140. The read data R_Data stored in the page buffer 130 may be sent to the error correction block 140 in units of codewords included in a parity field, for example. The error correction block 140 may perform error detection with respect to the provided codeword. If the detection result indicates that an error is present, the error correction block 140 obtains error location information by using a syndrome. Corrected data may be overwritten onto a latch of the page buffer 130 corresponding to the error location. If the detection result indicates that an error is not present, overwriting of the corrected data is skipped. If the error detection and correction operation is performed with respect to the whole data latched in the page buffer 130, error-corrected full-page data may be prepared in the page buffer 130.

If data of which the error detection and correction operation has completed is stored in the page buffer 130, in operation S140, the control logic 170 determines whether the read enable signal /RE has been received. If it is determined that the read enable signal /RE has not been received, the control logic 170 waits until the read enable signal /RE is received or may determine whether another control signal has been received. If it is determined that the read enable signal /RE has been received, the procedure proceeds to operation S150.

In operation S150, data stored in the page buffer 130 is sent to the randomizer/de-randomizer 150 for de-randomization under control of the control logic 170. The randomizer/de-randomizer 150 may perform a de-randomization operation with respect to an output data stream that is provided in synchronization with the read enable signal /RE.

In operation S160, output data, which is de-randomized by the randomizer/de-randomizer 150, is output to the outside through the input/output buffer 160.

A read method of the nonvolatile memory device 100 according to an embodiment of the inventive concept is briefly described. During a read operation, all data sensed through the page buffer 130 is written into the page buffer 130 without de-randomization after error detection and correction has completed. The de-randomization operation is performed with respect to data that is output from the page buffer 130 to the outside. In the de-randomization operation performed with respect to data error corrected according to the above description, overhead due to overwriting the page buffer 130 with data of which the arrangement has changed may be reduced. In addition, in the case where a detection result of the error correction block 140 according to an embodiment of the inventive concept indicates that no error is present in data, overwriting of the page buffer 130 with data is skipped. Accordingly, the read performance of the read method according to an embodiment of the inventive concept may be markedly improved.

Figure 6:
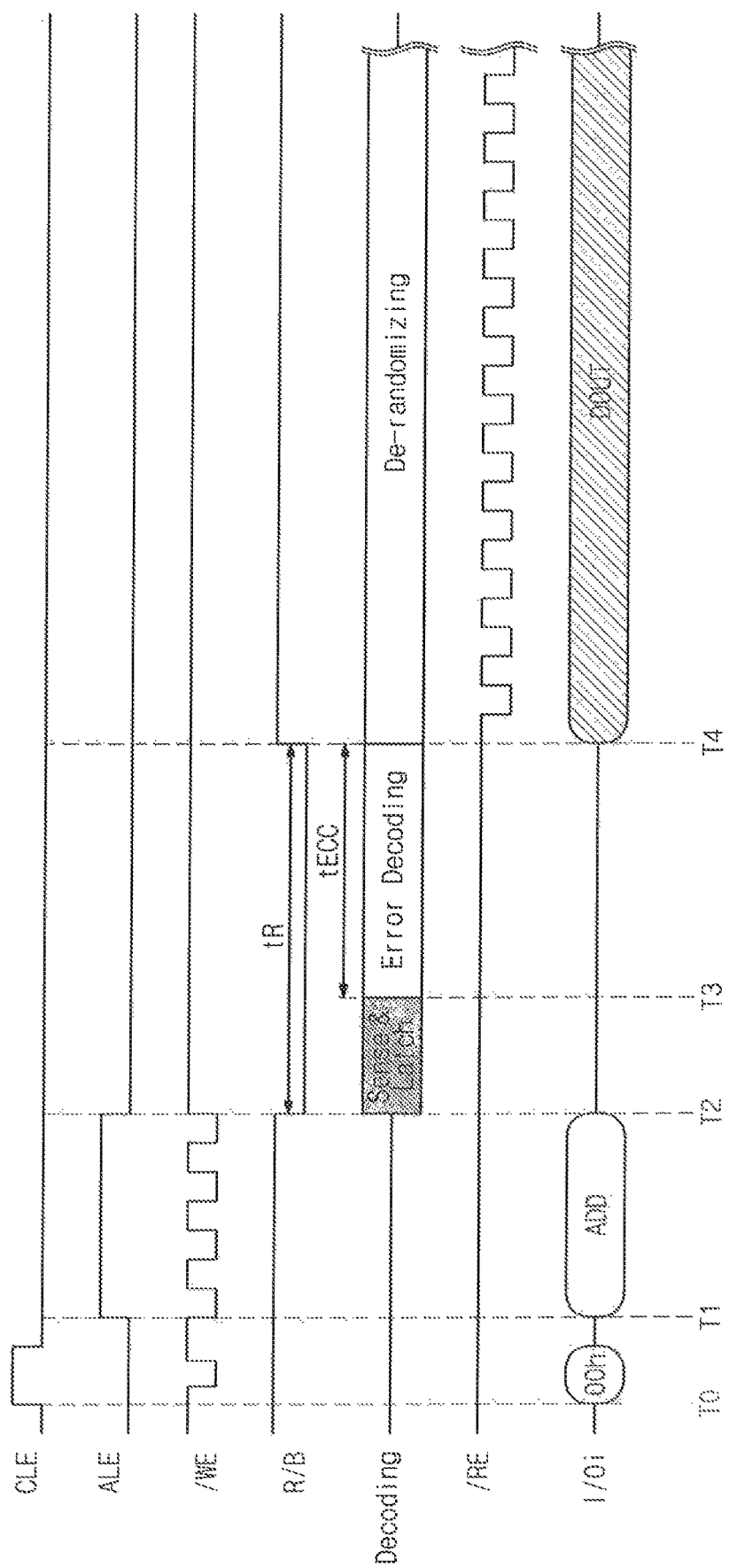
FIG. 6 is a timing diagram illustrating a read method of a nonvolatile memory device according to an exemplary embodiment of the inventive concept.

FIG. 6 is a timing diagram illustrating a read method of the nonvolatile memory device according to an exemplary embodiment of the inventive concept. Referring to FIG. 6, the nonvolatile memory device 100 performs error correction and de-randomization operations according to an embodiment of the inventive concept in response to a read command from the outside. This will be in more detail described below.

At a time T0, the nonvolatile memory device 100 receives the read command from the outside (e.g., a memory controller). For example, the nonvolatile memory device 100 receives the read command of "00h" through input/output data lines I/Oi. That is, the read command of "00h" is input to the nonvolatile memory device 100 when a write enable signal /WE is toggled during a high section of a command latch enable signal CLE.

At a time T1, an address ADD is received. For example, a row address and a column address of read-requested data are input to the nonvolatile memory device 100 when the write enable signal /WE is toggled during a high section of an address latch enable signal ALE. Here, it should be understood that a clock cycle of the write enable signal /WE for an input of the read address ADD is only exemplary.

After receipt of the read address ADD has completed, at time T2, the nonvolatile memory device 100 makes a ready/busy signal R/B transition to a busy state (e.g., logic low). The nonvolatile memory device 100 senses memory cells corresponding to the input address ADD and latches the sensed data in the page buffer 130.

At time T3, the nonvolatile memory device 100 performs error decoding with respect to the read data latched in the page buffer 130. That is, if the read data R_Data latched in the page buffer 130 is sent to the error correction block 140 in units of codewords, the error correction block 140 may detect an error with respect to the codewords, that is, the read data and may correct the detected error. Data from which an error is detected is corrected by the error correction block 140, and the corrected data may be overwritten onto the page buffer 130. The above-described error detection and correction process may be performed until time T4.

At time T4, the latched data in the page buffer 130 is de-randomized by an input/output unit in response to toggling of the read enable signal /RE, and the de-randomized data may be provided to the input/output buffer 160. The data from the randomizer/de-randomizer 150 may be output to the outside through the input/output buffer 160 and input/output pads (not illustrated).

It is understood from the above-described timing diagram that a time tR does not include a time needed to perform the de-randomization operation. Since the de-randomization operation is performed when data is output from the page buffer 130 to the input/output buffer 160, it may be performed in synchronization with a time at which the read enable signal /RE toggles. Accordingly, a time tR needed to sense and decode read-requested data may be markedly reduced. In addition, a time tECC needed to perform error decoding may be markedly reduced according to the use of the error correction block 140 according to an embodiment of the inventive concept. The reason is that the page buffer 130 is overwritten only when data in the page buffer 130 has an error.

Figure 7:
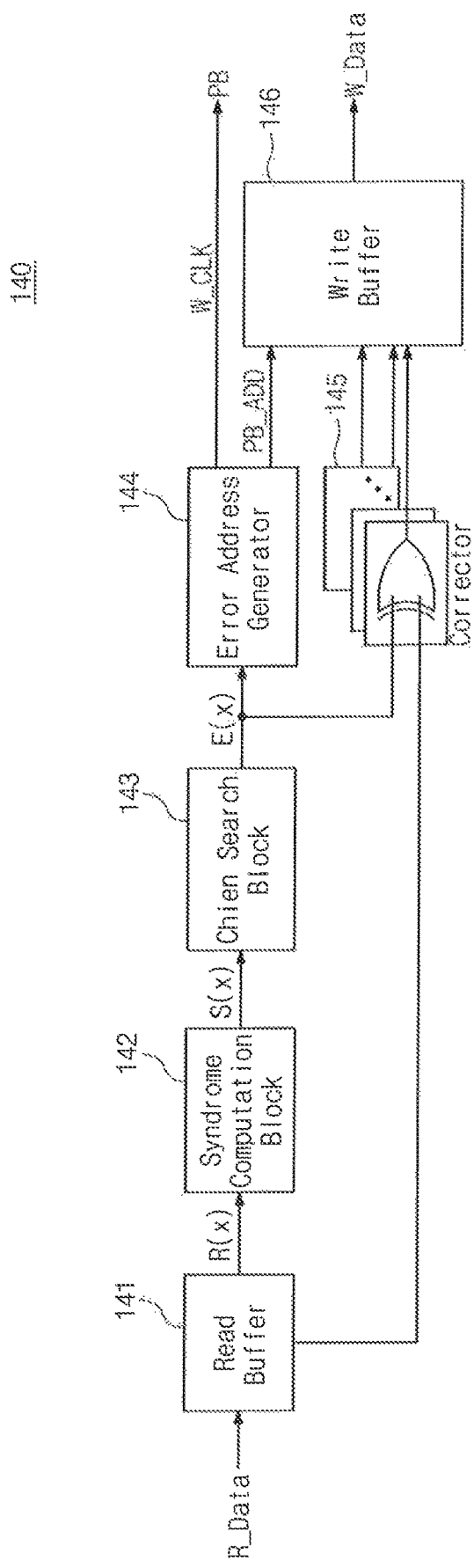
FIG. 7 is a block diagram illustrating an error correction block according to an exemplary embodiment of the inventive concept.

FIG. 7 is a block diagram illustrating the error correction block according to an exemplary embodiment of the inventive concept. Referring to FIG. 7, there will be described an example in which the error correction block 140 generates a syndrome by using the BCH code and detects an error location by using the syndrome. However, it is to be understood that various error correction codes capable of detecting an error location are applicable to embodiments of the inventive concept. The error correction block 140 includes a read buffer 141, a syndrome computation block 142, a Chien search block 143, an error address generator 144, a corrector 145, and a write buffer 146.

Data R(x) of a codeword unit sent from the page buffer 130 is stored in the read buffer 141. The data R(x) stored in the read buffer 141 is provided to the syndrome computation block 142.

The syndrome computation block 142 receives the data R(x) to compute a syndrome S(x). For example, the syndrome S(x) may be computed by multiplying a parity detection polynomial H(x) with the read data R(x). The parity detection polynomial H(x) may be generated using a root of a generation polynomial G(x). Whether an error is present in the read data R(x) is detected through the syndrome S(x). The syndrome S(x) includes overall error information of the data R(x). That is, the syndrome S(x) includes a location and a pattern of an error and a size of the error. Accordingly, with regard to the read data R(x), error bit detection, error correction, and detection whether an error is correctable may be determined through the syndrome S(x).

The Chien search block 143 generates an error correction vector E(x) by using the syndrome S(x). The syndrome S(x) computed by the syndrome computation block 142 may be provided to a key equation solver (KES) block (not illustrated). An error location polynomial σ(x) and an error pattern polynomial ω(x) may be generated from the syndrome S(x) by the KES block. The Chien search block 143 computes a root of the error location polynomial. A size of an error corresponding to each of error locations found through the error location polynomial is computed. If obtaining error locations and error sizes of the read data R(x) through a Chien search algorithm, the Chien search block 143 outputs the error correction vector E(x) for correcting the error. The error correction vector E(x) includes error location information on the provided codeword.

The error address generator 144 may generate address information of partial data to be overwritten onto the page buffer 130 by using the error correction vector E(x). A detailed configuration of the error address generator 144 will be described with reference to FIG. 9. The error address generator 144 generates a write clock W_CLK based on the detected error location and size and may output the write clock W_CLK to the page buffer (PB) 130. The error address generator 144 generates a page buffer address PB_ADD corresponding to a location of the page buffer 130 to be overwritten with corrected data.

The corrector 145 corrects data, in which an error is present, by using the error correction vector E(x). The corrector 145 may correct an error included in the read data R(x) by performing an exclusive XOR operation with respect to the read data R(x) stored in the read buffer 141 and the error correction vector E(x) computed by the Chien search block 143. The error-corrected data may be overwritten onto the page buffer 130 after being stored into the write buffer 146.

An exemplary configuration of the error correction block 140 is described with reference to FIG. 7. The error correction block 140 may perform error correction by overwriting the page buffer 130 only with partial data, in which an error is present, with reference to the error location. If it is detected that no error is present in a processed codeword, latches of the page buffer 130, in which the codeword is stored, need not be overwritten.

Figure 8:
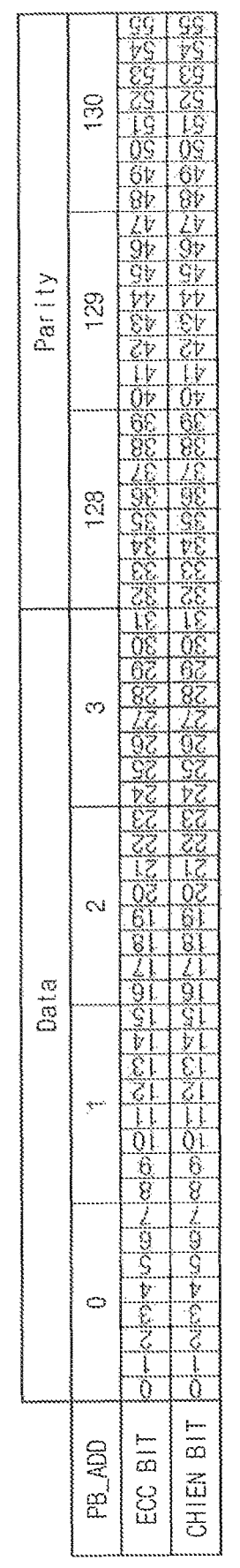

FIG. 8 is a table briefly illustrating an ECC frame corresponding to an error decoding result with respect to a codeword provided to the error correction block 140. Referring to FIG. 8, the ECC frame includes a page buffer address PB_ADD, an error correction bit ECC BIT, and a Chien bit corresponding to error location information.

Here, the page buffer address PB_ADD corresponds to a location in the page buffer 130 of a codeword provided for error detection. The error correction bit ECC BIT indicates a bit location in the ECC frame. The Chien bit CHIEN BIT indicates a location of an error detected through an error detection operation. For example, in the case where a logical value of the Chien bit CHIEN BIT is "1", a location of the Chien bit is determined as a location where an error is present.

Figure 9:
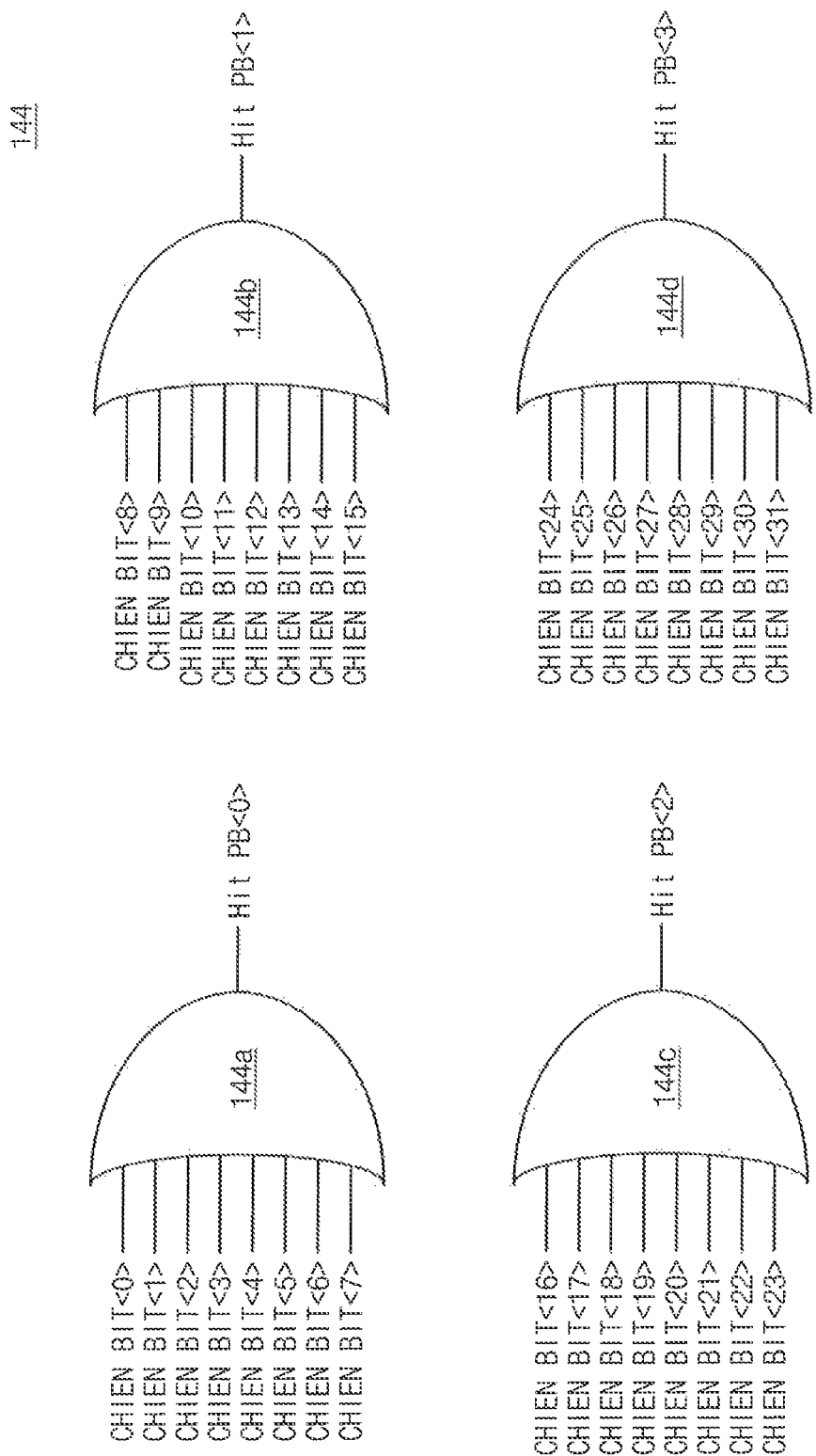
FIG. 9 is a diagram illustrating a structure of an error address generator.

FIG. 9 is a diagram illustrating a structure of the error address generator according to an exemplary embodiment of the inventive concept. Referring to FIG. 9, the error address generator 144 is used for detecting the page buffer address PB_ADD where an error is generated.

An address of the page buffer 130 to be overwritten may be determined by Chien bits CHIEN BIT provided as a result of performing an error detection operation with respect to a codeword. Chien bits CHIEN BIT<0> to CHIEN BIT<7> are input to a first gate 144a. When at least one of the Chien bits CHIEN BIT<0> to CHIEN BIT<7> has a binary "1", a page buffer area corresponding to ECC bits ECC BIT<0> to ECC BIT<7> may be overwritten with error-corrected data. That is, hit information associated with a page buffer <0> may be output as "1".

Chien bits CHIEN BIT<8> to CHIEN BIT<15> are input to a second gate 144b. When at least one of the Chien bits CHIEN BIT<8> to CHIEN BIT<15> has a binary "1", a page buffer area corresponding to ECC bits ECC BIT<8> to ECC BIT<15> may be overwritten with error-corrected data. That is, hit information associated with a page buffer <1> may be output as "1".

Chien bits CHIEN BIT<16> to CHIEN BIT<23> are input to a third gate 144c. When at least one of the Chien bits CHIEN BIT<16> to CHIEN BIT<23> has a binary "1", a page buffer area corresponding to ECC bits ECC BIT<16> to ECC BIT<23> may be overwritten with error-corrected data. That is, hit information associated with a page buffer <2> may be output as "1".

Chien bits CHIEN BIT<24> to CHIEN BIT<31> are input to a fourth gate 144d. When at least one of the Chien bits CHIEN BIT<24> to CHIEN BIT<31> has a binary "1", a page buffer area corresponding to ECC bits ECC BIT<24> to ECC BIT<31> may be overwritten with error-corrected data. That is, hit information associated with a page buffer <3> may be output as "1".

Figure 10:
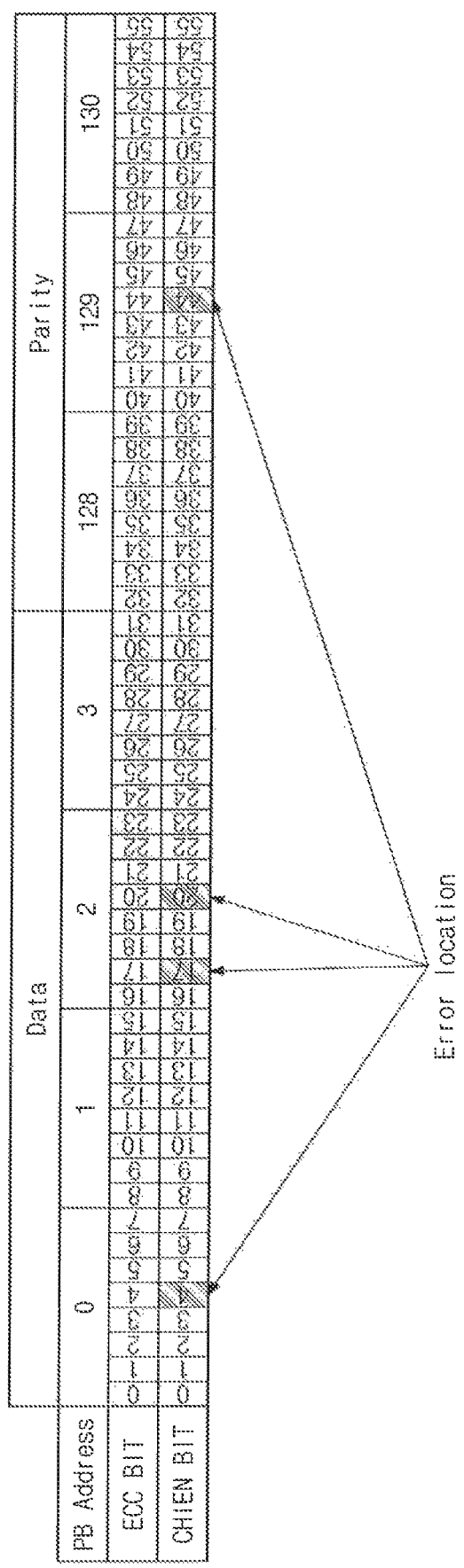
FIG. 10 shows an example of the ECC frame in which an error is detected.

FIG. 10 briefly shows an example of an ECC frame in which an error is detected. Referring to FIG. 10, it is assumed that locations where an error is generated are ECC bits <4>, <17>, <20>, and <44>. In this case, it is assumed that logical values of Chien bits <4>, <17>, <20>, and <44> are "1" and logical values of the remaining Chien bits are "0".

Figure 11A:
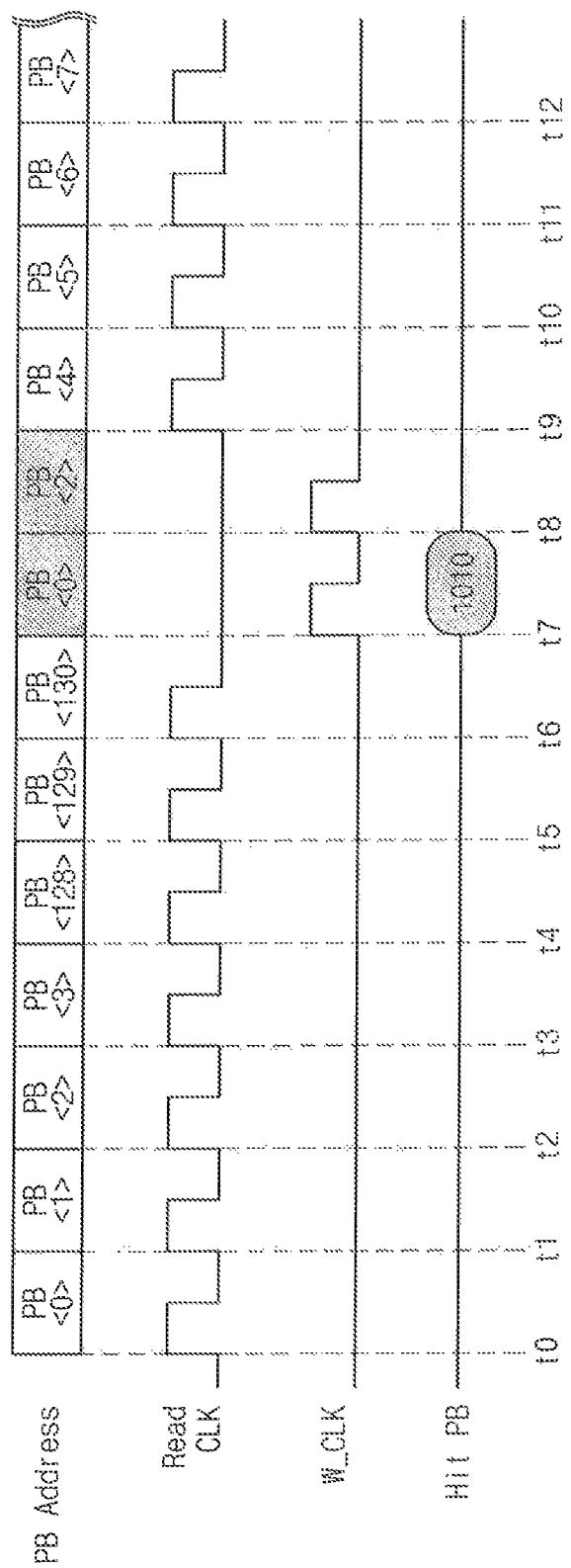
FIG. 11A is a timing diagram illustrating an overwrite operation with respect to a page buffer under an ECC frame condition of FIG. 10.

FIG. 11A is a timing diagram illustrating an overwrite operation with respect to the page buffer 130 under an ECC frame condition of FIG. 10. Referring to FIG. 11A, the overwrite operation is composed of an operation (t0 to t7) of reading a codeword for error detection and correction from the page buffer 130 and an operation (t7 to t9) of overwriting a detected error location with corrected data. An operation performed following t9 corresponds to a read operation of another codeword.

First, a codeword of an error detection target is provided to the read buffer 141 between time t0 and time t7. The codeword may be sent from the page buffer 130 to the read buffer 141 in synchronization with the read clock. As an error detection operation and a correction operation are performed, the ECC frame may be generated in a form described with reference to FIG. 10. Since logical values of Chien bits <4>, <17>, <20>, and <44> are "1", corrected data may be overwritten only with respect to page buffer addresses PB<0> and PB<2> where an error is present. 4-Bit hit information of "1010" may be provided. That is, the hit information of "1010" means that overwriting is performed only with respect to page buffer addresses PB<0> and PB<2>. Accordingly, the write clock W_CLK is provided to the page buffer 130 during two cycles. That is, the page buffer 130 is overwritten only with partial data to be error corrected.

Figure 11B:
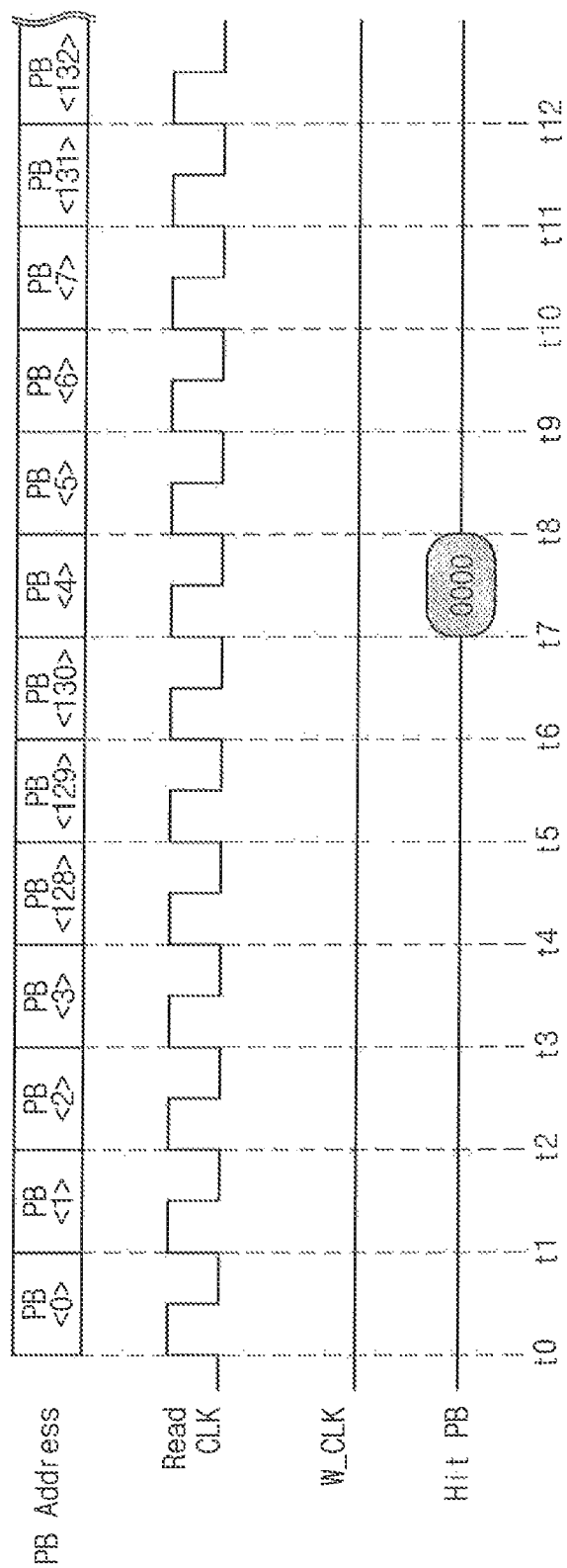
FIG. 11B is a timing diagram illustrating a method of processing a codeword where no error exists.

FIG. 11B is a timing diagram illustrating a method of processing a codeword when no error is present. Referring to FIG. 11B, if an error is not detected from a codeword read from the page buffer 130, an operation of overwriting the page buffer 130 with corrected data is skipped.

First, a codeword of an error detection target is provided to the read buffer 141 between times t0 and t7. The codeword may be sent from the page buffer 130 to the read buffer 141 in synchronization with the read clock. The ECC frame may be generated while an error detection operation and a correction operation are performed. In the case where a Chien bit, of which the logical value is "1", is not present in the ECC frame generated as the result of the error detection operation, hit information Hit PB of "0000" may be generated. That is, the hit information of "0000" indicates that no error is present in the sent codeword. In this case, there is no need to overwrite the page buffer 130 with corrected data. Accordingly, the write clock W_CLK remains at an inactive state. After time t7, another codeword may be sent from the page buffer 130 to the error correction block 140.

The feature of the error correction block 140 according to an embodiment of the inventive concept is described above. The error correction block 140 according to an embodiment of the inventive concept performs an overwrite operation with respect to a part of the page buffer 130 when an error is present. Accordingly, there may be markedly reduced overhead due to an overwrite operation with respect to the page buffer 130 in the case where no error is present.

Figure 12:
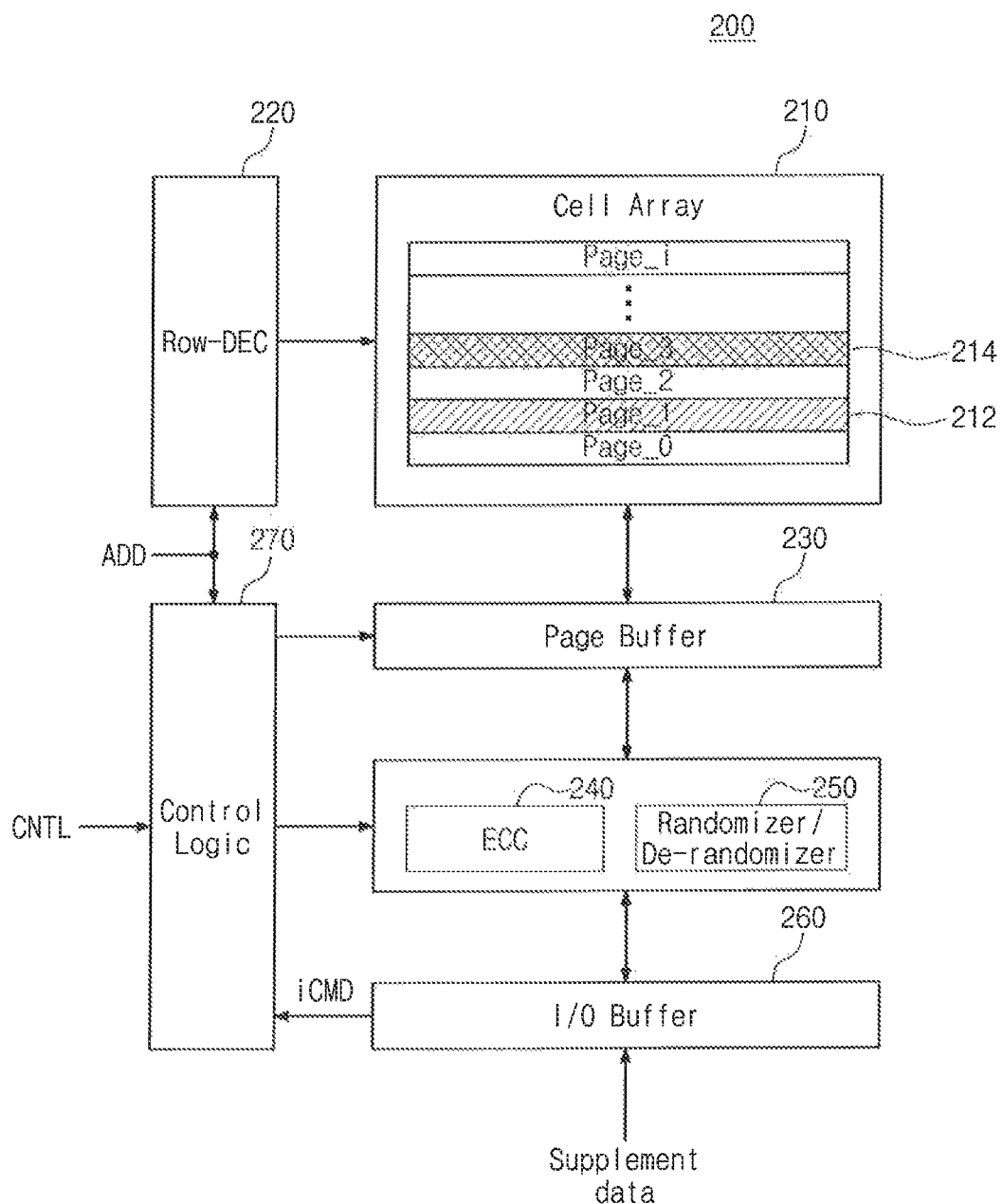
FIG. 12 is a block diagram illustrating a nonvolatile memory device according to an exemplary embodiment of the inventive concept.

FIG. 12 is a block diagram illustrating the nonvolatile memory device according to an exemplary embodiment of the inventive concept. Referring to FIG. 12, the nonvolatile memory device 200 includes a cell array 210, a row decoder 220, a page buffer 230, an error correction block 240, a randomizer/de-randomizer 250, an input/output buffer 260, and control logic 270. Herein the cell array 210, the row decoder 220, the page buffer 230, the error correction block 240, the randomizer/de-randomizer 250, the input/output buffer 260, etc. are substantially the same as those described with reference to FIG. 1. Thus, a detailed description thereof is omitted here.

The nonvolatile memory device 200 may perform a randomization operation and an error correction operation with respect to data read from a source area and may store the resultant data in a destination area. In particular, the nonvolatile memory device 200 according to an embodiment of the inventive concept updates a portion of source data read from the source area and stores the updated result in the destination area. Hereinafter, the copy-back operation is referred to as an "update copy-back operation. Data in a flash memory cannot be over-written and must be erased before it can be re-written to. In NAND flash, erases happen at the block granularity, where a block includes multiple pages. Some of the pages may contain valid data and some of the pages may contain invalid data. Multiple source blocks with valid data can be freed by copying the valid data of these blocks to another destination block, and then erasing the source blocks. The copying may be performed by the copy-back operation.

In the copy-back operation, a row address of a source page may be different from a row address of a destination page. In the nonvolatile memory device 200 in which the randomizer/de-randomizer 250 generating a seed on the basis of the row address is implemented on an on-chip, a seed of the source page may be different from a seed of the destination page. Accordingly, in the case where the update copy-back operation is performed, a seed of a source page stored in the page buffer 230 and a seed of supplement data input from the outside may have different values. For this reason, it is difficult to perform the update copy-back operation without making randomization arrangements of the source and destination pages equal to each other.

The cell array 210 includes a plurality of memory blocks. Each memory block is divided into a plurality of pages or page areas. During the copy-back operation, source data read from a page area is temporarily stored in the page buffer 230. In an exemplary embodiment, the source data is updated with supplement data provided from outside of the nonvolatile memory device 200. In an embodiment, the size of the supplement data is smaller than that of one page.

The control logic 270 performs the following process procedure if supplement data for updating the source data during the copy-back operation is present. Here, it is assumed that the source data is data read from a first page area 212 and a destination area is a third page area 214. If receiving a read command for source data corresponding to a copy-back target, the control logic 270 may control the page buffer 230 so as to sense and latch the source data from the first page area 212. If it is detected that supplement data for updating the source data is present, the control logic 270 perform a randomization operation with respect to the supplement data. The randomization operation may be performed by using the same seed as that of the source data. The randomized supplement data may be overwritten onto the source data stored in the page buffer 230.

Afterwards, the control logic 270 may control the error correction block 240 and the randomizer/de-randomizer 250 so as to perform randomization processing and error correction encoding for programming the updated source data into the third page area 214 as a destination area. First, the randomizer/de-randomizer 250 de-randomizes the source data updated with the supplement data by using a source seed. Next, the de-randomized data is randomized by using a destination seed corresponding to a destination area. Then, the error correction block 240 may selectively perform error correction encoding with respect to the data randomized by using the destination seed. The data processed through the error correction encoding may be overwritten onto the page buffer 230 and then may be programmed into the destination area.

A function of the nonvolatile memory device 200 for the update copy-back operation is briefly described. The update copy-back operation may be triggered when supplement data for updating source data is present. If the supplement data is detected, the source data may be updated by randomizing the supplement data by using a source seed and overwriting the source data with the randomized supplement data. Afterwards, the updated source data may be written into the destination area through de-randomization using the source seed and randomization using the destination seed. In this case, it is to be understood that error correction encoding may be performed. The above-described randomization scheme may make it possible to update source data during the copy-back operation.

Figure 13:
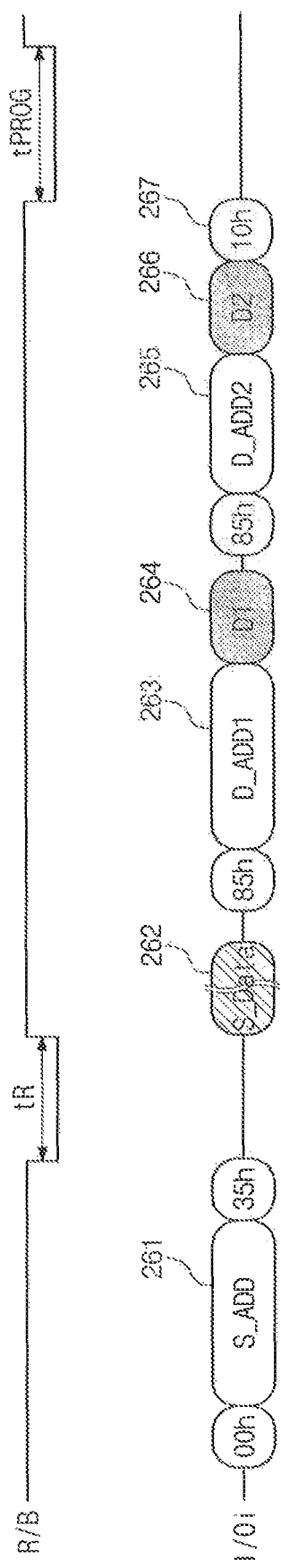
FIG. 13 is a timing diagram illustrating a command sequence for performing an update copy-back operation on the nonvolatile memory device, according to an exemplary embodiment of the inventive concept.

FIG. 13 is a timing diagram illustrating a command sequence for performing an update copy-back operation on the nonvolatile memory device, according to an exemplary embodiment of the inventive concept. Referring to FIG. 13, a read command for source data S_Data 262 and supplement data D1 264 and D2 266 for updating the source data are input to the nonvolatile memory device 200 for the update copy-back operation.

First, a command sequence for reading the source data S_Data 262 is provided for the update copy-back operation according to an embodiment of the inventive concept. For example, a command sequence '00h'-'S_ADD'-'35h' may be input to the nonvolatile memory device 200 in a period during which the ready/busy signal R/B remains at a ready state ("high"). Here, a source address 261 is an address of source data to be copied back. In response to the command sequence '00h'-'S_ADD'-'35h', the nonvolatile memory device 200 makes the ready/busy signal R/B transition to a busy state ("low") and senses and latches data of a source area by using the page buffer 230.

The source data S_Data 262 latched in the page buffer 230 can be output to the outside in response to a read enable signal (not illustrated). FIG. 13 illustrates an embodiment where the source data S_Data is output to the outside through input/output lines I/Oi. However, it should be understood that there is no need to output the source data S_Data during the update copy-back operation.

Next, an address of a destination area where the source data S_Data 262 is to be written and the supplement data D1 264 and D2 266 are input to the nonvolatile memory device 200. Here, an address D_ADD1 263 of the destination area and supplement data D1 264 may be input to the nonvolatile memory device 200 in a command sequence '85h'-'D_ADD1'-'D1'. The address D_ADD1 263 may include a row address of the destination area and a column address corresponding to the supplement data D1 264. In addition, supplement data D2 266 is provided through a command sequence '85h'-'D_ADD2'-'D2'. The address D_ADD2 265 may include a column address corresponding to the supplement data D2 266. Afterwards, if a confirm command 267 of '10h' is provided, the nonvolatile memory device 200 performs randomization and de-randomization operations for updating the source data S_Data, according to an embodiment of the inventive concept. Here, the number of events that the supplement data D1 264 and D2 266 are input to the nonvolatile memory device 200 may be variously changed by a user.

Figure 14:
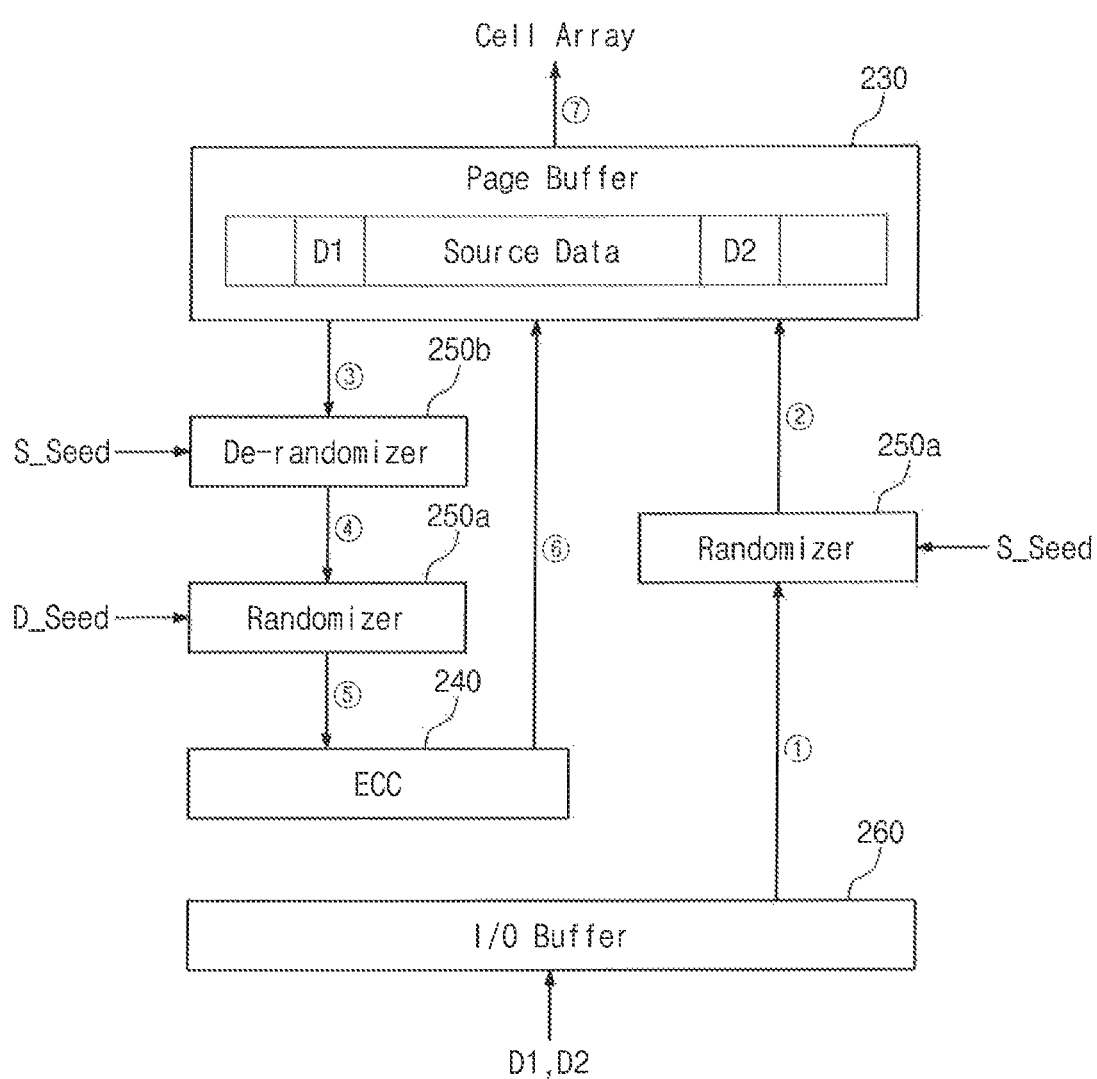
FIG. 14 is a block diagram illustrating the process of performing the update copy-back operation on the nonvolatile memory device, according to an exemplary embodiment of the inventive concept.

FIG. 14 is a block diagram illustrating the process of performing the update copy-back operation on the nonvolatile memory device, according to an exemplary embodiment of the inventive concept. Referring to FIG. 14, a destination address and supplement data D1 and D2 are received together with a copy-back command from the outside of the nonvolatile memory device 200. Here, it is assumed that source data S_Data of a source area is latched in the page buffer 230 in advance.

The supplement data D1 and D2 may be provided to a randomizer 250a through the input/output buffer 260. Here, the randomizer 250a may be a portion of a function of the randomizer/de-randomizer 250 or a part thereof. An arrow marked by "①" indicates a flow of the supplement data D1 and D2 to the randomizer 250a.

The randomizer 250a may perform a randomization operation with respect to the supplement data D1 and D2, respectively. In this case, the supplement data D1 and D2 are randomized by using a source seed S_Seed that is used to randomize the source data S_Data. In an embodiment, a high-speed random sequence generation scheme, in which the source seed S_Seed and a column address are used, is used to randomize the supplement data D1 and D2. The supplement data D1 and D2 randomized by using the source seed S_Seed may be overwritten onto the source data S_Data latched in the page buffer 230. This data flow is marked by "②".

The source data S_Data, which is overwritten with the randomized supplement data D1 and D2 on the page buffer 230, full-page data randomized through the same source seed S_Seed. Accordingly, there may be prevented an issue due to mismatch of randomization processing between the source data S_Data and the supplement data D1 and D2. Next, the updated source data S_Data is provided to a de-randomizer 250*b*. This data flow is marked by "③".

The de-randomizer 250*b* de-randomizes the source data S_Data updated by using the source data S_Seed. Then, the updated and de-randomized source data S_Data is sent to the randomizer 250*a*. This data flow is marked by "④".

The randomizer 250*a* randomizes the updated and de-randomized source data S_Data. In this case, the updated and de-randomized source data S_Data is randomized by using the destination seed D_Seed. The source data S_Data, which is randomized by using the destination seed D_Seed, is sent to the error correction block 240. This data flow is marked by "⑤".

The error correction block 240 performs error correction encoding with respect to the source data S_Data randomized by using the destination seed D_Seed. The error correction block 240 may again overwrite the encoded source data S_Data onto the page buffer 230. This data flow is marked by "⑥". Here, encoding of the error correction block 240 may be selectively performed. If the error correction block 240 is not implemented on an on-chip, error correction encoding may be skipped during the update copy-back operation.

The loaded source data S_Data on the page buffer 230 is written into the destination area of the cell array 210. This data flow is marked by "⑦".

The update copy-back operation of the nonvolatile memory device 200 according to an embodiment of the inventive concept is briefly described. If supplement data for update is randomized by using a source seed, it may be prevent an issue due to a difference between arrangements of randomized supplement data and randomized source data.

Figure 15:
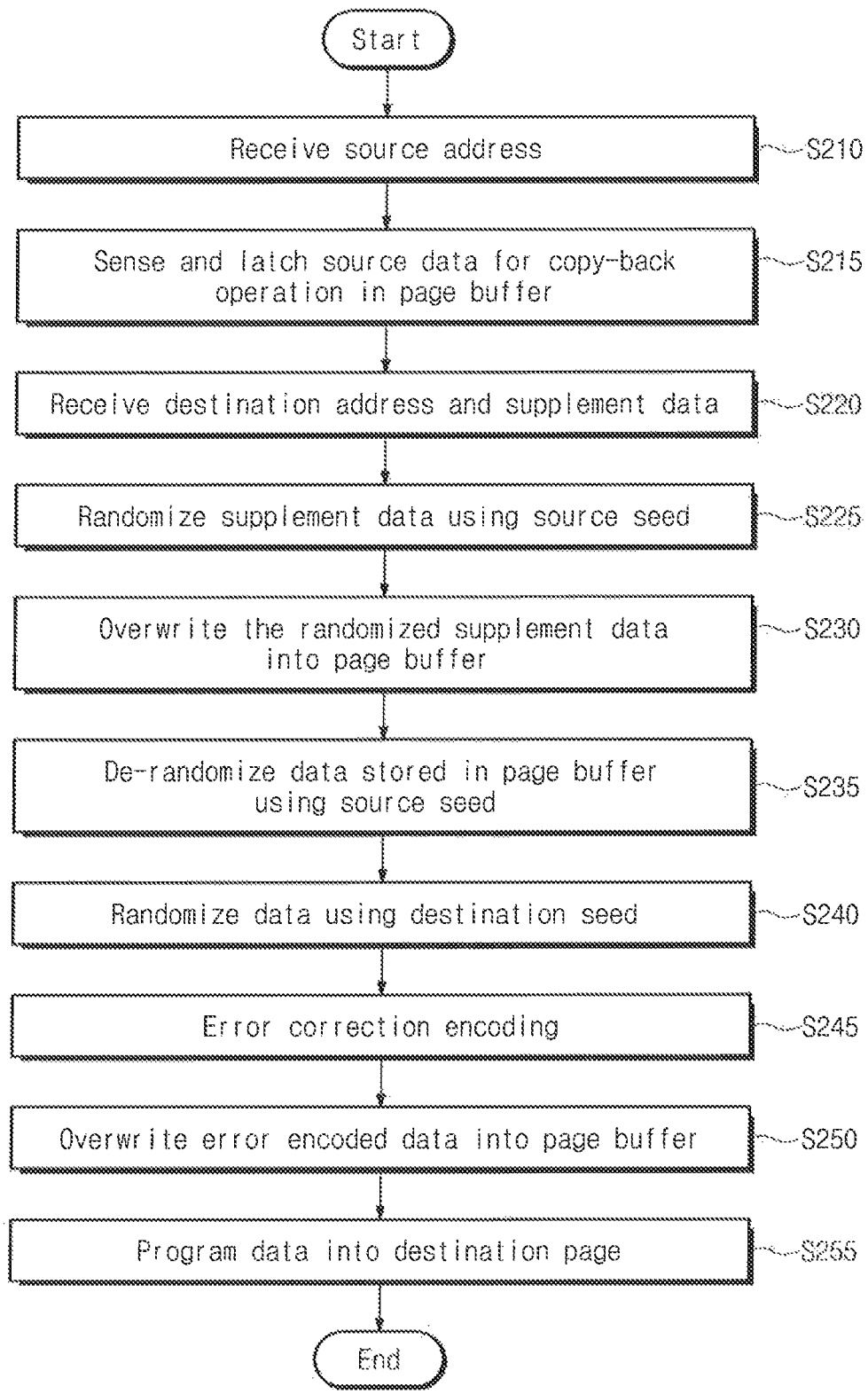
FIG. 15 is a flowchart illustrating an update copy-back method according to an exemplary embodiment of the inventive concept.

FIG. 15 is a flowchart illustrating an update copy-back method according to an exemplary embodiment of the inventive concept. Referring to FIG. 15, an update copy-back operation of the nonvolatile memory device 200 is performed if a copy-back command, a source address, a destination address, and supplement data are received from the outside. Below, the update copy-back operation according to an exemplary embodiment of the inventive concept will be described with reference to FIG. 15.

In operation S210, the nonvolatile memory device 200 receives a source address S_ADD together with the copy-back command. The source address S_ADD may include a page address of a source area where the source data S_Data is stored.

In operation S215, the nonvolatile memory device 200 senses data from the source area by using the page buffer 230. The nonvolatile memory device 200 latches the sensed source data S_Data into the page buffer 230.

In operation S220, the nonvolatile memory device 200 receives the destination address D_ADD and the supplement data from the outside. The destination address D_ADD may include a row address to which source data updated with the supplement data is to be copied. In addition, the destination address D_ADD may include a column address of the supplement data.

In operation S225, the nonvolatile memory device 200 performs a randomization operation with respect to the supplement data. In this case, the supplement data is randomized by using a source seed S_Seed that is used to randomize the source data S_Data.

In operation S230, the nonvolatile memory device 200 overwrites the randomized supplement data onto the source data S_Data latched in the page buffer 230. The source data S_Data may be updated by the overwrite operation. The source data S_Data, which is overwritten with the randomized supplement data on the page buffer 230, corresponds to page data randomized by using the same source seed S_Seed.

In operation S235, the nonvolatile memory device 200 performs an additional procedure for writing the source data, which is updated with the supplement data, in a destination area. First, the nonvolatile memory device 200 de-randomizes the source data, which is updated with the supplement data, by using the source seed S_Seed.

In operation S240, the nonvolatile memory device 200 randomizes the de-randomized source data S_Data by using a destination seed D_Seed. The destination seed S_Seed may be generated from the destination address provided together with the copy-back command.

In operation S245, the nonvolatile memory device 200 performs error correction encoding with respect to the source data S_Data that is randomized by using the destination seed D_Seed. The error correction encoding with respect to the source data S_Data may be selectively performed.

In operation S250, the nonvolatile memory device 200 overwrites the encoded data on the page buffer 230.

In operation S255, the nonvolatile memory device 200 controls the page buffer 230 such that the updated and randomized source data S_Data loaded on the page buffer 230 is written into the destination area of the cell array 210.

The procedure in which the nonvolatile memory device 200 performs the update copy-back operation is described above. The supplement data input for update may be first of all randomized by using the source seed S_Seed for the update copy-back operation.

Figure 16:
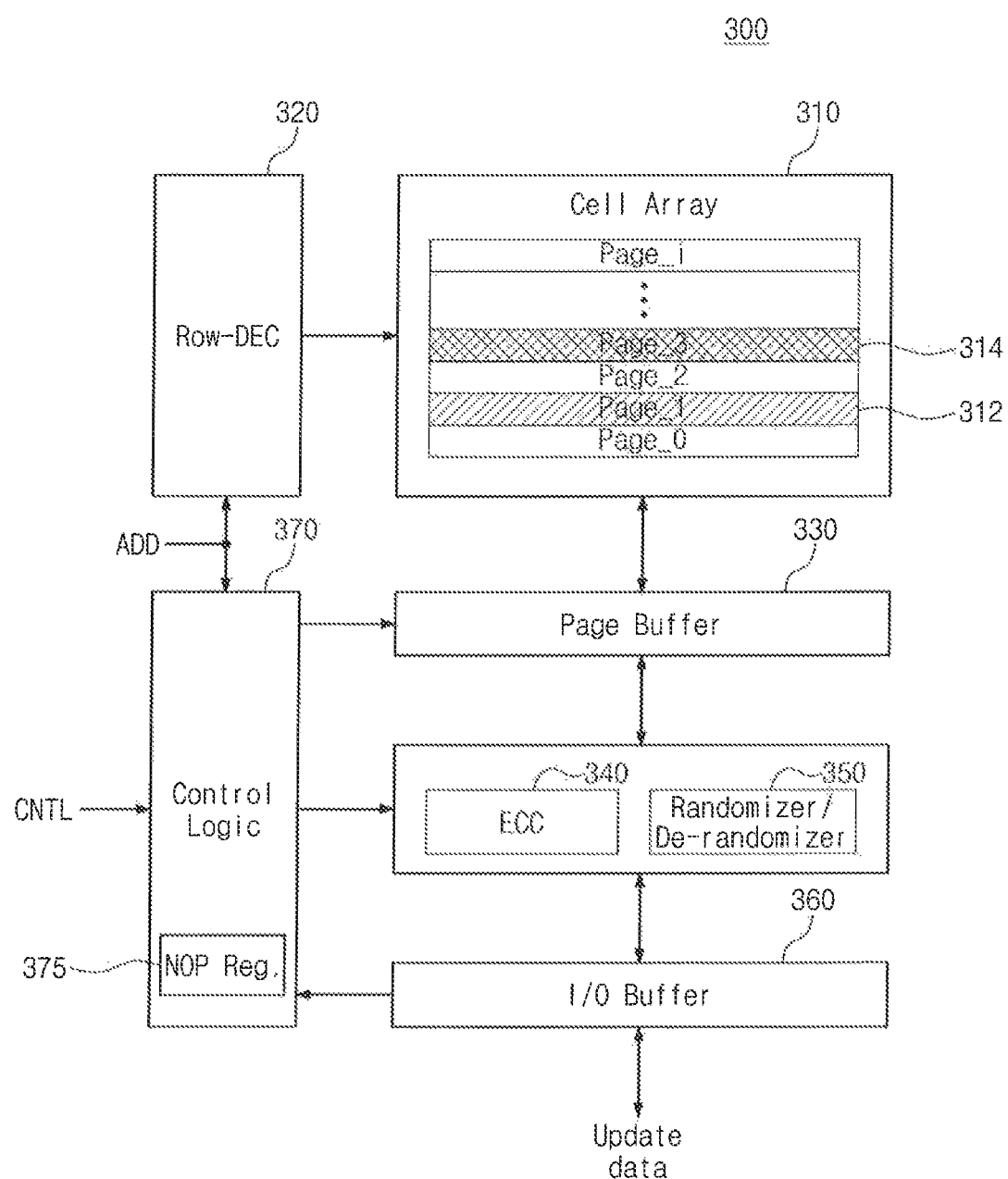
FIG. 16 is a block diagram of a nonvolatile memory device according to an exemplary embodiment of the inventive concept.

FIG. 16 is a block diagram of a nonvolatile memory device according to an exemplary embodiment of the inventive concept. Referring to FIG. 16, a nonvolatile memory device 300 includes a cell array 310, a row decoder 320, a page buffer 330, an error correction block 340, a randomizer/de-randomizer 350, an input/output buffer 360, and control logic 370. Here, the cell array 310, the row decoder 320, the page buffer 330, the error correction block 340, the randomizer/de-randomizer 350, and the input/output buffer 360 are substantially the same as those described with reference to FIG. 12. Thus, a detailed description thereof is omitted here.

The nonvolatile memory device 300 may perform a randomization operation and an error correction operation with respect to data read from a source area and may store the resultant data in a destination area. In particular, the nonvolatile memory device 300 may manage a page by using a plurality of write units. Here, one page is divided into a plurality of write units NOP1, NOP2, NOP3, and NOP4. The NOP in NOP1-4 may stand for number of program unit.

The nonvolatile memory device according to an exemplary embodiment of the inventive concept randomizes and updates source data stored in the page buffer 330 by the write unit during the copy-back operation. In addition, the updated data may be programmed into the cell array 310 by the write unit. To this end, the nonvolatile memory device 300 may include an NOP register 375. A state of the NOP register 375 may be updated according to the progress of the update copy-back operation. The updated data may be stored in a destination area based on the state of the NOP register 375. In an embodiment, not a full page but a partial page is programmed into the destination area based on the state of the NOP register 375.

FIG. 17 is a diagram illustrating a page area divided into a plurality of write units. Referring to FIG. 17, a page area may include, for example, four write units NOP1 to NOP4 and a flag area storing states of the write units NOP1 to NOP4. The write units NOP1 to NOP4 may be programmed independently of each other. In an embodiment, only one of the write units in a page area is at a programmed state, and the remaining write units are at an erased state. State information of the write units NOP1 to NOP4 is stored in the flag area.

During the update copy-back operation, a write unit to be updated with supplement data or a write unit, which is to be randomized even though not updated, may be programmed into a destination area of the cell array 310. Accordingly, there is no need to perform a program operation with respect to a write unit that remains at an erased state in both source data and destination area. The nonvolatile memory device 300 according to an embodiment of the inventive concept may update supplement data by using the NOP register 375 during the copy-back operation. Also, the nonvolatile memory device 300 may program updated page data in the cell array 310 by the write unit. Accordingly, it may be possible to reduce a time needed to perform the copy-back operation.

FIG. 18 is a table illustrating a copy-back operation performed based on the NOP register of FIG. 16. Referring to FIG. 18, the NOP register 375 may store state information about each of the write units NOP1 to NOP4 whenever the update copy-back operation is performed. The control logic 370 may perform the update of source data, which is stored in the page buffer 330, and programming of the updated source data in a destination area, based on state information stored in the NOP register 375. Below, the procedure of performing the update copy-back operation with reference to the NOP register 375 will be described for each step.

A field value of a state number 1 of the NOP register 375 indicates a state of a source area that is read requested for a copy-back operation. For example, the write units NOP1 and NOP2 indicate a state in which data is programmed, and the write units NOP3 and NOP4 indicate an erased state. In this case, values of the write units NOP1 to NOP4 corresponding to a state number 2 are set to "TTFF".

A state number 3 indicates whether supplement data Din received for the update operation corresponds to any one of the write units NOP1 to NOP4. In the case where a column address of the supplement data Din corresponds to the write units NOP2 and NOP3, a value of a state number 3 is set to "FTTF".

Information on whether to randomize the write units NOP2 and NOP3 corresponding to the supplement data Din may be stored in a register of a state number 4. In the write unit NOP2, data of an existing source page may be updated with the supplement data. Accordingly, there is a need to randomize the supplement data, which is updated on the write unit NOP2, by using a source seed. However, in the write data NOP3, since the source data remains at an erase state, there is no need to perform a randomization operation by using the source seed. Accordingly, data corresponding to the write units NOP1, NOP3, and NOP4 remain at a source data state in the page buffer 330. In contrast, randomized supplement data may be overwritten on latches of the page buffer 330 corresponding to the write unit NOP2.

Location information of a write unit to be updated with the supplement data may be stored in a register of a state number 5. That is, a state value of "T" may be allocated to each of the write units NOP2 and NOP3 to be updated with the supplement data.

A write unit, to which a de-randomization operation will be applied, is stored in a register of a state number 6. A de-randomization operation using a source seed may be applied only to a write unit that is randomized by using the source seed. Accordingly, the randomizer/de-randomizer 350 may be provided with only data corresponding to the write units NOP1 and NOP2 from the page buffer 330 and may de-randomize the provided data by using the source seed.

A write unit, which will be randomized by using a destination seed, is designated in a register of a state number 7. Data of the write units NOP1 and NOP2, which is de-randomized by using the source seed, and data of the write unit NOP3, to which a de-randomization operation is not applied, may be randomized by using the destination seed. For this reason, in a register of the state number 7, each of the write units NOP1, NOP2, and NOP3 is set to "T".

Write units, which are substantially programmed in the destination area, are designated in a register of a state number 8. Data may be programmed in a page area corresponding to the write units NOP1, NOP2, and NOP3. However, a memory area corresponding to the write unit NOP4 may remain at an erased state.

An example in which the update copy-back operation according to an embodiment of the inventive concept is performed under the condition that a page area is divided into a plurality of write units is described. In this case, a write operation associated with a write unit to be maintained at the erased state may be skipped. In addition, randomization and de-randomization operations of the randomizer/de-randomizer 350 with respect to supplement data to be updated on an erased write area may be skipped.

Figure 19:
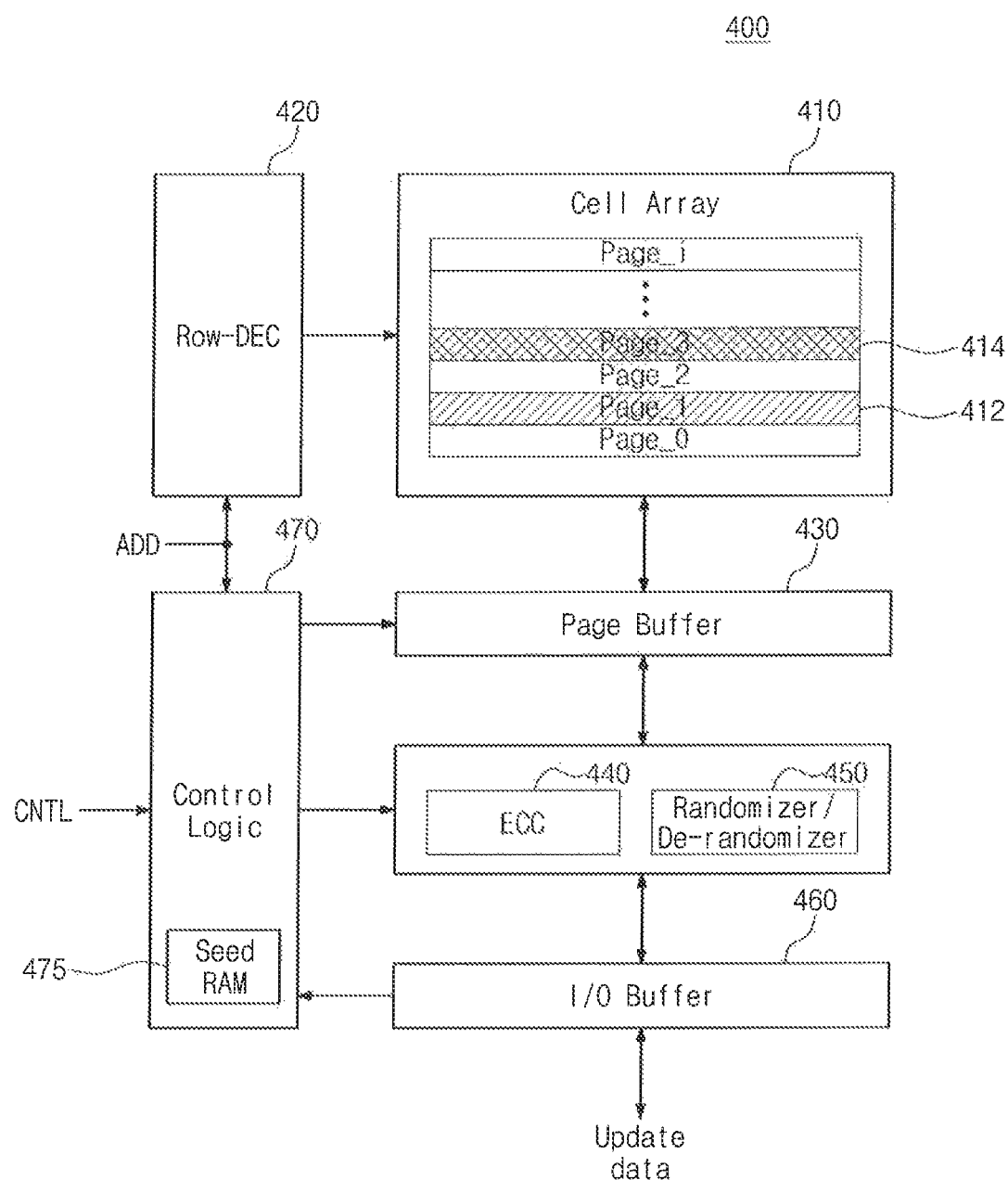
FIG. 19 is a block diagram illustrating a nonvolatile memory device according to an exemplary embodiment of the inventive concept.

FIG. 19 is a block diagram illustrating a nonvolatile memory device according to an exemplary embodiment of the inventive concept. Referring to FIG. 19, a nonvolatile memory device 400 includes a cell array 410, a row decoder 420, a page buffer 430, an error correction block 440, a randomizer/de-randomizer 450, an input/output buffer 460, and control logic 470. The cell array 410, the row decoder 420, the page buffer 430, the error correction block 440, the randomizer/de-randomizer 450, and the input/output buffer 460 are substantially the same as those described with reference to FIGS. 1, 12, and 16. Thus, a detailed description thereof will not be repeated here.

The nonvolatile memory device 400 includes a seed RAM 475 that stores source and destination seeds for a randomization or de-randomization operation. The source or destination seed, which is obtained from an address input through a command sequence, is stored in the seed RAM 475. To rapidly provide a seed corresponding to a specific column address with regard to a page area, seed values may be stored in the seed RAM 475 in the form of a table or in various forms.

FIG. 20 is a circuit diagram illustrating one of a plurality of memory blocks included in the cell array in FIG. 1, 12, 16, or 19. In an embodiment, a first memory block BLK1 having a three-dimensional structure will be described with reference to FIG. 20. Referring to FIG. 20, the first memory block BLK1 includes a plurality of cell strings CS11, CS12, CS21, and CS22. The cell strings CS11, CS12, CS21, and CS22 may be arranged along a row direction and a column direction to form rows and columns.

For example, the cell strings CS11 and CS12 may be connected to string selection lines SSL1a and SSL1b to constitute a first row. The cell strings CS21 and CS22 may be connected to string selection lines SSL2a and SSL2b to constitute a second row. For example, the cell strings CS11 and CS21 may be connected to a first bit line BL1 to constitute a first column. The cell strings CS12 and CS22 may be connected to a second bit line BL2 to constitute a second column.

Each of the cell strings CS11, CS12, CS21, and CS22 may include a plurality of cell transistors. For example, each of the cell strings CS11, CS12, CS21, and CS22 may include string selection transistor SSTa and SSTb, a plurality of memory cells MC1 to MC8, ground selection transistors GSTa and GSTb, and dummy memory cells DMC1 and DMC2. In an embodiment, each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by the row direction and the column direction. The string selection transistors SSTa and SSTb may be serially connected and may be arranged between the memory cells MC1 to MC8 and a bit line BL. In each cell string, the ground selection transistors GSTa and GSTb may be serially connected and may be arranged between the memory cells MC1 to MC8 and a common source line CSL.

In an embodiment, in each cell string, a first dummy memory cell DMC1 is arranged between the memory cells MC1 to MC8 and the ground selection transistors GSTa and GSTb. In an embodiment, in each cell string, a second dummy memory cell DMC2 is arranged between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an embodiment, ground selection transistors in the same row are connected to the same ground selection line, and ground selection transistors in different rows are connected to another ground selection line. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In an embodiment, even though not illustrated in FIG. 20, ground selection transistors arranged at the same height from a substrate (not illustrated) are connected to the same ground selection line, and ground selection transistors provided at a different height are connected to a different ground selection line. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, memory cells MC1 to MC8 of the cell strings CS11, CS12, CS21, and CS22 may be connected to first to eighth word lines WL1 to WL8.

String selection transistors, which belong to the same row, from among the first string selection transistors SSTa at the same height may be connected to the same string selection line, and string selection transistors, which belong to different rows, from among the first string selection transistors SSTa at the same height may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL1a.

Likewise, string selection transistors, which belong to the same row, from among the second string selection transistors SSTb at the same height may be connected to the same string selection line, and string selection transistors, which belong to different rows, from among the second string selection transistors SSTb at the same height may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Even though not illustrated in FIG. 20, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an embodiment, dummy memory cells at the same height are connected with the same dummy word line, and dummy memory cells at different heights are connected with different dummy word lines. For example, the first dummy memory cells DMC1 may be connected to a first dummy word line DWL1, and the second dummy memory cells DMC2 may be connected to a second dummy word line DWL2.

In the first memory block BLK1, read and write operations may be performed in units of rows. For example, a row of the first memory block BLK1 may be selected by the string selection lines SSL1a, SSL1b, SSL2a, and SSL2b. For example, the cell strings CS11 and CS12 in the first row may be respectively connected to the bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in the second row may be respectively connected to the bit lines BL1 and BL2 when the turn-on voltage is supplied to the string selection lines SSL2a and SSL2b and the turn-off voltage is supplied to the string selection lines SSL1a and SSL1b. Memory cells, which are arranged at the same height, from among memory cells in cell strings connected to the driven word line may be selected by driving a word line. Read and write operations may be performed with respect to the selected memory cells. The selected memory cells may constitute a physical page unit.

In the memory block BLK1, memory cells may be erased in units of memory blocks or sub-blocks. When an erase operation is performed in units of memory blocks, all memory cells MC in the memory block BLK1 may be simultaneously erased according to an erase request. When the erase operation is performed in units of sub-blocks, some of memory cells MC in the memory block BLK1 may be simultaneously erased according to an erase request while the remaining memory cells thereof may be erase-inhibited. A low voltage (e.g., a ground voltage) may be supplied to a word line connected to erased memory cells, and a word line connected to erase-inhibited memory cells may be floated.

The first memory block BLK1 illustrated in FIG. 20 is only exemplary. For example, the number of cell strings may be increased or decreased, and the number of rows of cell strings and the number of columns of cell strings may be increased or decreased according to the number of cell strings. In the first memory block BLK1, the number of transistors (GST, MC, DMC, SST, or the like) may be increased or decreased, and a height of the first memory block BLK1 may be increased or decreased according to the number of the transistors. Furthermore, the number of lines (GSL, WL, DWL, SSL, etc.) connected with transistors may be increased or decreased according to the number of the transistors.

Figure 21:
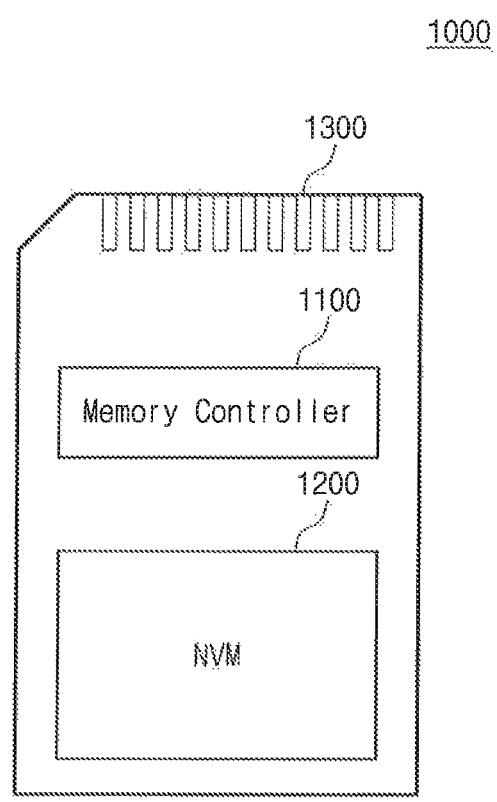
FIG. 21 is a block diagram illustrating a memory card system including a nonvolatile memory system according to an exemplary embodiment of the inventive concept.

FIG. 21 is a block diagram illustrating a memory card system including a nonvolatile memory system according to an exemplary embodiment of the inventive concept. Referring to FIG. 21, the memory card system 1000 includes a memory controller 1100, a nonvolatile memory 1200, and a connector 1300.

The memory controller 1100 is connected to the nonvolatile memory 1200. The memory controller 1100 is configured to access the nonvolatile memory 1200. For example, the memory controller 1100 is configured to control an overall operation of the nonvolatile memory 1200 including, but not limited to, a read operation, a write operation, an erase operation, and a background operation. The background operation includes operations such as wear-leveling management and garbage collection.

The memory controller 1100 is configured to provide an interface between the nonvolatile memory 1200 and a host. The memory controller 1100 is configured to drive firmware for controlling the nonvolatile memory 1200. In an embodiment, the memory controller 1100 may include elements such as, but not limited to, a RAM, a processing unit, a host interface, a memory interface, and an error correction unit.

The memory controller 1100 may communicate with an external device through the connector 1300. The memory controller 1100 may communicate with an external device (e.g., a host) based on a specific communication protocol. For example, the memory controller 1100 may communicate with the external device through at least one of various communication protocols such as, but not limited to, universal serial bus (USB), multimedia card (MMC), eMMC (embedded MMC), peripheral component interconnection (PCI), PCI-express (PCI-E), advanced technology attachment (ATA), a serial-ATA, parallel-ATA, small computer small interface (SCSI), enhanced small disk interface (ESDI), integrated drive electronics (IDE), Firewire, universal flash storage (UFS), and nonvolatile memory express (NVMe). In an embodiment, a write command defined by the above-described standards may include size information of write data.

The nonvolatile memory 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 1100 and the nonvolatile memory 1200 are integrated into a single semiconductor device. The memory controller 1100 and the nonvolatile memory 1200 may be integrated in a single semiconductor device to form a solid state drive (SSD). The memory controller 1100 and the nonvolatile memory 1200 may be integrated into a single semiconductor device to constitute a memory card. For example, the memory controller 1100 and the nonvolatile memory 1200 may be integrated into a single semiconductor device to form a memory card such as, but not limited to, a PC card (a personal computer memory card international association (PCMCIA) card), a compact flash card (CF), a smart media card (SM, SMC), a memory stick, a multimedia card (MMC, RS-MMC, MMCmicro, eMMC), an SD card (SD, miniSD, microSD, SDHC), and a universal flash storage (UFS).

Figure 22:
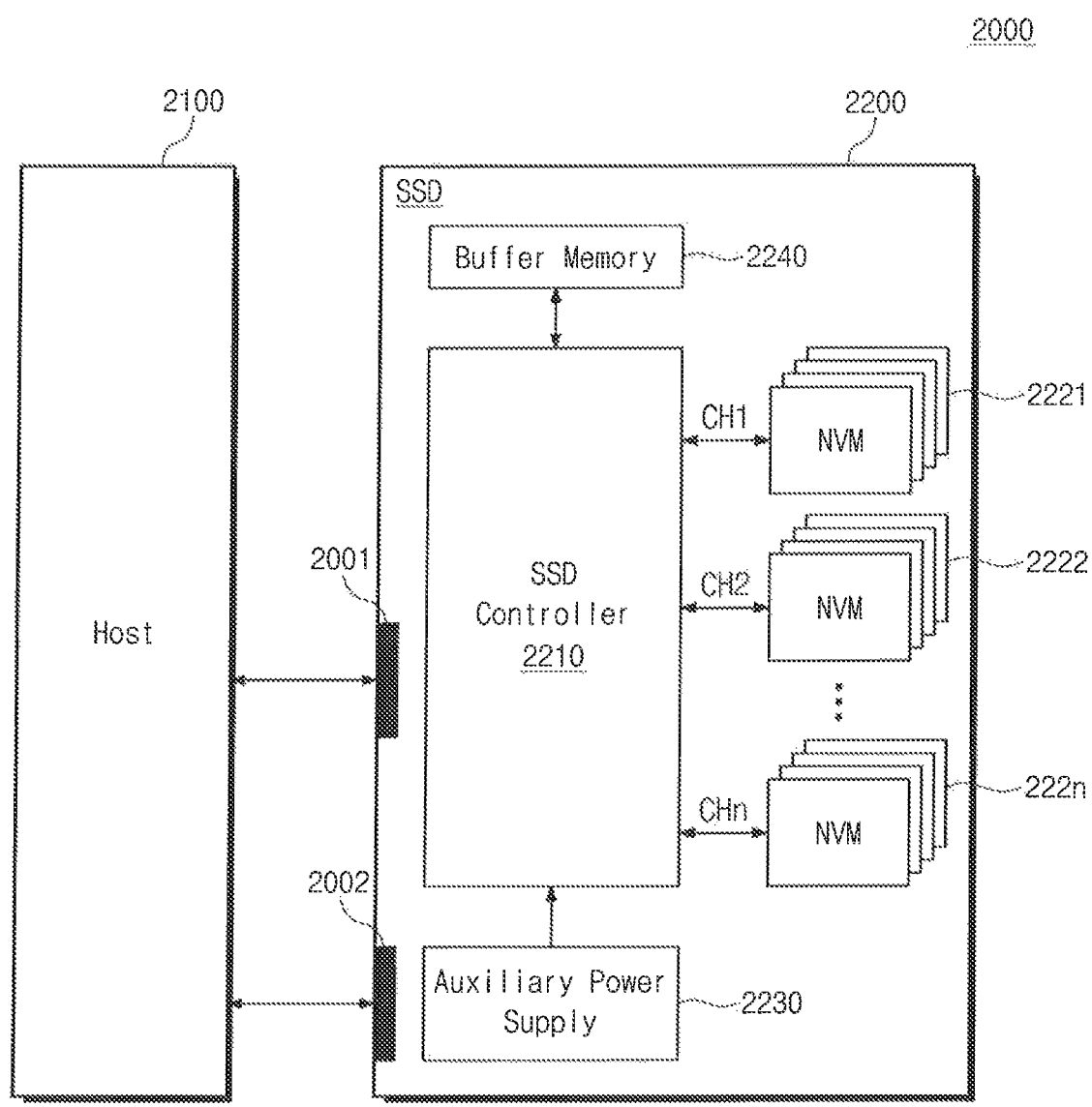
FIG. 22 is a block diagram illustrating a solid state drive system including a nonvolatile memory system according to an exemplary embodiment of the inventive concept.

FIG. 22 is a block diagram illustrating a solid state drive system including a nonvolatile memory system according to an exemplary embodiment of the inventive concept. Referring to FIG. 22, the solid state drive (SSD) system 2000 includes a host 2100 and an SSD 2200. The SSD 2200 exchanges a signal with the host 2100 via a signal connector 2001 and receives electric power via a power connector 2002. The SSD 2200 includes an SSD controller 2210, a plurality of flash memories 2221 to 222n, an auxiliary power supply 2230, and a buffer memory 2240.

The SSD controller 2210 may control the flash memories 2221 to 222n in response to the signal from the host 2100.

The auxiliary power supply 2230 is connected to the host 2100 via the power connector 2002. The auxiliary power supply 2230 may receive the electric power from the host 2100 and may be charged by the electric power. When the electric power is not smoothly supplied from the host 2100, the auxiliary power supply 2230 may power the SSD system 2000. The auxiliary power supply 2230 may be placed inside or outside the SSD 2200. For example, the auxiliary power supply 2230 may be put on a main board to supply auxiliary electric power to the SSD 2200.

The buffer memory 2240 operates as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 222n. The buffer memory 2240 may include volatile memories such as a DRAM, a SDRAM, a DDR SDRAM, an LPDDR SDRAM, and an SRAM or nonvolatile memories such as a FRAM a ReRAM, a STT-MRAM, and a PRAM.

Figure 23:
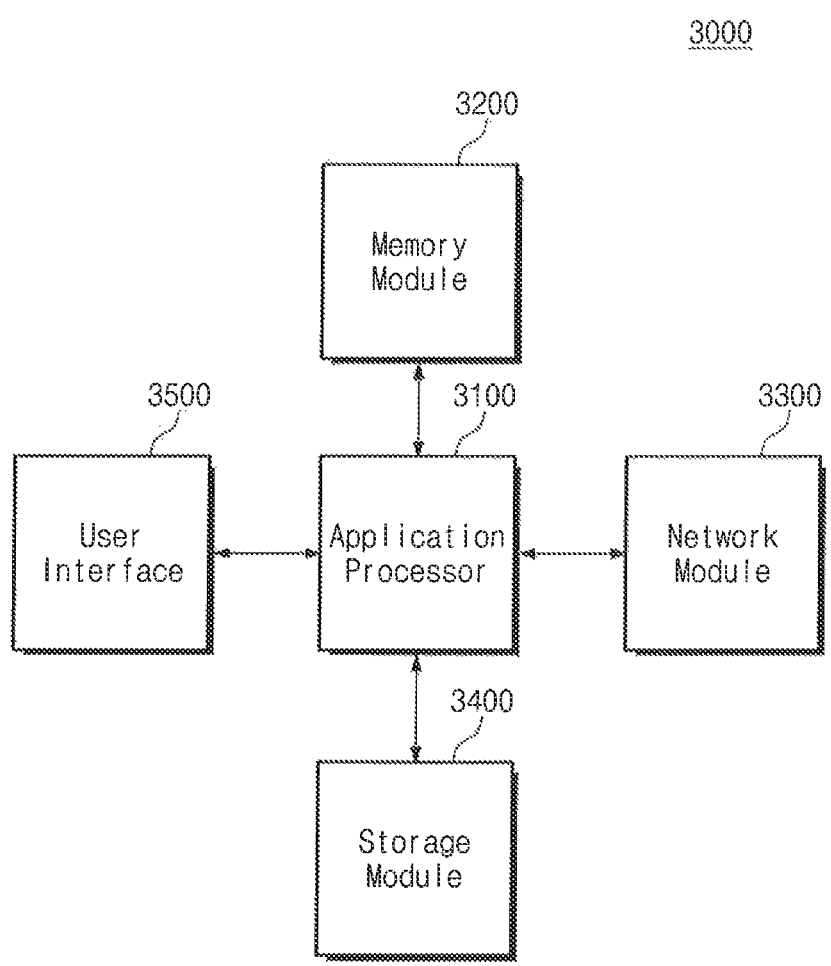
FIG. 23 is a block diagram illustrating a user system including a nonvolatile memory system according to an exemplary embodiment of the inventive concept.

FIG. 23 is a block diagram illustrating a user system including a nonvolatile memory system according to an exemplary embodiment of the inventive concept. Referring to FIG. 23, the user system 3000 includes an application processor 3100, a memory module 3200, a network module 3300, a storage module 3400, and a user interface 3500.

The application processor 3100 may drive elements, an operating system, etc. of the user system 3000. For example, the application processor 3100 may include controllers for controlling elements of the user system 3000, graphics engines, a variety of interfaces, etc. For example, the application processor 3100 may be a system-on-chip (SoC).

The memory module 3200 may operate as a main memory, a working memory, a buffer memory, or a cache memory of the user system 3000. The memory module 3200 may be implemented with a volatile random access memory, such as a DRAM, an SDRAM, a double date rate DRAM (DDR SDRAM), a DDR2 SDRAM, a DDR3 SDRAM, an LPDDR DRAM, an LPDDR2 DRAM, or an LPDDR3 DRAM or a nonvolatile random access memory, such as a PRAM, an MRAM, a RRAM, or a FRAM.

The network module 3300 may communicate with external devices. For example, the network module 3300 may support wireless communications, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, and WI-DI. In an embodiment, the network module 3300 may be included in the application processor 3100.

The storage module 3400 may store data. For example, the storage module 3400 may store data received from the application processor 3100. Alternatively, the storage module 3400 may provide the application processor 3100 with data stored therein. For example, the storage module 3400 may be implemented with a semiconductor memory device such as a PRAM, an MRAM, a RRAM, a NAND flash memory, a NOR flash memory, or a three-dimensional NAND flash memory.

The user interface 3500 may include interfaces which input data or a command to the application processor 3100 or output data to an external device. For example, the user interface 3500 may include user input interfaces such as a keyboard, a keypad, buttons, a touch panel, a touch screen, a touch pad, a touch ball, a camera, a microphone, a gyroscope sensor, and a vibration sensor. The user interface 3500 may further include user output interfaces such as a liquid crystal display (LCD), an organic light-emitting diode (OLED) display device, an active matrix OLED (AMO-LED) display device, a light-emitting diode (LED), a speaker, and a motor.

According to an embodiment of the inventive concept, it may be possible to reduce a time needed to output data when an error is not detected, at a nonvolatile memory device. In addition, a nonvolatile memory device, which includes an on-chip ECC and an on-chip randomization block, may be provided to perform a randomization operation and an error correction operation without conflict in the case of updating partial data or writing supplement data, during a copy-back operation.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for reading a nonvolatile memory device including an on-chip error correcting circuit (ECC) and an on-chip randomizer, the method comprising:
    storing data sensed from selected memory cells of the nonvolatile memory device into a page buffer;
    performing, by the on-chip ECC, an error decoding operation with respect to the sensed data including at least one codeword having first data and at least one first parity bit to generate error correction decoded data including at least codeword having second data derived from the first data and at least one second parity bit derived from the at least one first parity bit and to overwrite the error correction decoded data onto the page buffer; and
    de-randomizing, the error correction decoded data stored in the page buffer, by the on-chip randomizer, by using a seed after the error decoding operation has completed.

2. The method of claim 1, wherein the error decoding operation comprises:
    computing an error location of the sensed data, which is divided into a plurality of correction units so as to be provided in units of codewords;
    correcting an error of a correction unit corresponding to the error location; and
    overwriting a correction unit, of which an error is corrected, from among the correction units on the page buffer.

3. The method of claim 2, wherein the error location is computed in a Bose-Chaudhuri Hocquenghem (BCH) code scheme.

4. The method of claim 2, wherein the overwriting of the data is skipped if the error decoding operation determines that none of the codewords include an error.

5. The method of claim 1, wherein the nonvolatile memory device outputs a ready/busy signal of a ready state if the error decoding operation is completed.

6. The method of claim 5, wherein the de-randomizing is performed when a read enable signal is input to the nonvolatile memory device.

7. The method of claim 1, wherein during the de-randomizing, the seed is generated from a column address of the sensed data.

8. The method of claim 1, further comprising: outputting the de-randomized data to the outside of the nonvolatile memory device.

9. A nonvolatile memory device comprising:
    a cell array including at least one memory cell;
    a page buffer configured to sense and store data in the cell array;
    an on-chip error correcting circuit to perform error correction decoding with respect to the sensed data including at least one codeword having first data and at least first parity bit to generate error correction decoded data including at least one codeword having a second data derived from the first data and at least one second parity bit derived from the at least one first parity bit and to overwrite the error correction decoded data onto the page buffer;
    an on-chip randomizer configured to de-randomize the error correction decoded data stored in the page buffer by using a seed after the error decoding operation has completed; and
    a control circuit configured to store write data into the page buffer in response to an external write command, use the on-chip randomizer to scramble the write data to generate scrambled data, use the on-chip error correcting circuit to perform error correction encoding on the scrambled data to generate encoded data, overwrite the write data stored in the page buffer with the encoded data, and copy the encoded data stored in the page buffer to the cell array.

10. The nonvolatile memory device of claim 9, wherein the on-chip randomizer scrambles the write data loaded on the page buffer using a random sequence.

11. The nonvolatile memory device of claim 10, wherein the error correction circuit encodes the scrambled data to add parity bits.

12. The nonvolatile memory device of claim 11, wherein the error correction circuit generates the parity bits by using at least one of a Bose-Chaudhuri Hocquenghem (BCH) code, a hamming code, a Reed-Solomon (RS) code, a turbo code, and a low-density parity-check (LDPC) code.

13. The nonvolatile memory device of claim 9, wherein the on-chip randomizer comprises:
- a seed generator configured to generate a seed by using address of the write data;
- a random sequence generator configured to generate the random sequence from the seed; and
- a mixer configured to mix the write data and the random sequence to generate the scrambled data.

14. A nonvolatile memory device comprising:
a cell array including memory cells arranged in rows and columns;
a page buffer configured to write data in the cell array or sense and store data stored in the cell array;
an on-chip scramble circuit, configured to randomize data to be written in the cell array, to provide the randomized data to the page buffer or de-randomize data output from the page buffer;
an on-chip error correction circuit configured to perform error correction decoding with respect to the sensed data including, at least one codeword having first data and at least first parity bit; and
a control logic circuit configured to control the page buffer, the on-chip scramble circuit, and the on-chip error correction circuit in response to a command or control signal from an external device, wherein during a read operation, the control logic circuit controls the pace buffer and the scramble circuit such that data stored in the page buffer is decoded by the error correction circuit and such that the error correction decoded data is overwritten on the page buffer, and
wherein the control logic circuit controls the on-chip scramble circuit such that a de-randomization operation is performed when the error correction decoded data including at least one codeword having second data derived from the first data and at least one second parity bit derived from the at least one first parity bit is overwritten the page buffer is output.

15. The nonvolatile memory device of claim 14, wherein during the error correction decoding, the error correction circuit corrects a data unit, in which an error is included, of data stored in the page buffer and overwrites the page buffer with the corrected data unit.

16. The nonvolatile memory device of claim 15, wherein the control logic circuit controls the scramble circuit such that the de-randomization operation is activated at a point in time when a read enable signal is activated.

17. The nonvolatile memory device of claim 16, wherein the control logic circuit randomizes supplement data, which is input during a copy-back operation for updating source data, by using a source seed corresponding to the source data and updates the source data stored in the page buffer by using the randomized supplement data.

18. The nonvolatile memory device of claim 14, further comprising: an input/output buffer configured to output the de-randomized data from the on-chip scramble circuit to the external device.

19. The nonvolatile memory device of claim 18, wherein the input/output buffer outputs the de-randomized data in response to a read enable signal from the external device.

20. The nonvolatile memory device of claim 14, wherein each of the memory cells comprises a charge trap layer and the cell array is a three-dimensional memory array.

* * * * *